(12) United States Patent
Ching et al.

(10) Patent No.: US 11,626,509 B2
(45) Date of Patent: Apr. 11, 2023

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Kuo-Cheng Ching, Hsinchu County (TW); Shi-Ning Ju, Hsinchu (TW); Kuan-Ting Pan, Taipei (TW); Kuan-Lun Cheng, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 69 days.

(21) Appl. No.: 17/314,763

(22) Filed: May 7, 2021

(65) Prior Publication Data

US 2021/0265485 A1 Aug. 26, 2021

Related U.S. Application Data

(60) Division of application No. 16/713,199, filed on Dec. 13, 2019, now Pat. No. 11,004,960, which is a continuation of application No. 15/635,337, filed on Jun. 28, 2017, now Pat. No. 10,510,873.

(51) Int. Cl.
| | | |
|---|---|---|
| *H01L 29/66* | (2006.01) | |
| *H01L 27/11* | (2006.01) | |
| *H01L 27/092* | (2006.01) | |
| *H01L 29/06* | (2006.01) | |
| *H01L 21/8238* | (2006.01) | |

(52) U.S. Cl.
CPC .. *H01L 29/6681* (2013.01); *H01L 21/823821* (2013.01); *H01L 21/823878* (2013.01); *H01L 27/0924* (2013.01); *H01L 27/1104* (2013.01); *H01L 29/0653* (2013.01)

(58) Field of Classification Search
CPC ......... H01L 29/6681; H01L 21/823821; H01L 21/823878; H01L 27/0924; H01L 27/1104; H01L 29/0653
USPC ....................................................... 257/369
See application file for complete search history.

(56) References Cited

U.S. PATENT DOCUMENTS

| | | |
|---|---|---|
| 2011/0147847 A1 | 6/2011 | Cea et al. |
| 2014/0145248 A1 | 5/2014 | Cheng et al. |
| 2018/0019316 A1 | 1/2018 | Cheng et al. |

*Primary Examiner* — Dzung Tran
(74) *Attorney, Agent, or Firm* — Birch, Stewart, Kolasch & Birch, LLP

(57) ABSTRACT

A semiconductor device includes a substrate, a first dielectric fin, a semiconductor fin, a metal gate structure, an epitaxy structure, and a contact etch stop layer. The first dielectric fin is disposed over the substrate. The semiconductor fin is disposed over the substrate, in which along a lengthwise direction of the first dielectric fin and the semiconductor fin, the first dielectric fin is in contact with a first sidewall of the semiconductor fin. The metal gate structure crosses the first dielectric fin and the semiconductor fin. The epitaxy structure is over and in contact with the semiconductor fin. The contact etch stop layer is over and in contact with first dielectric fin.

20 Claims, 28 Drawing Sheets

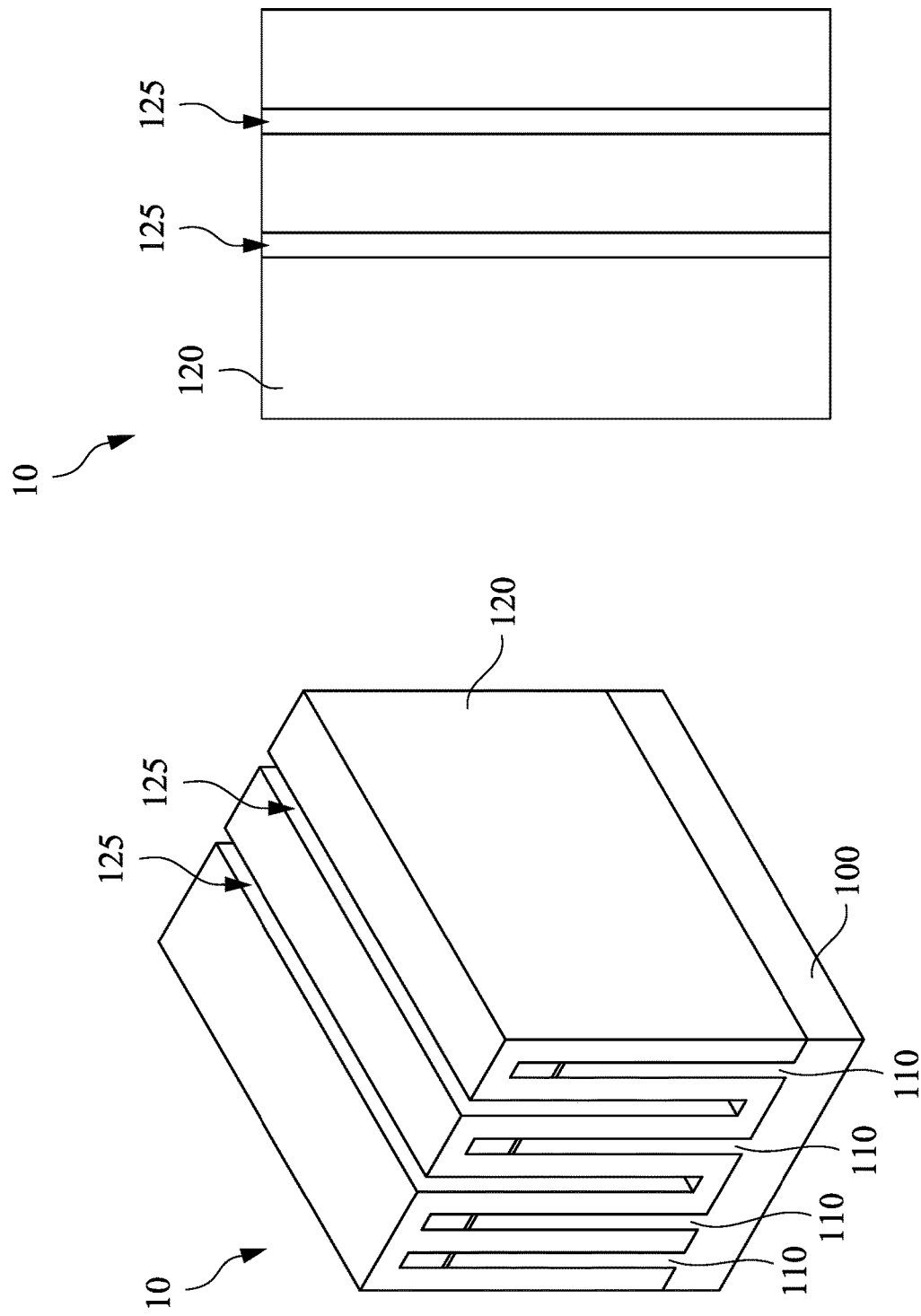

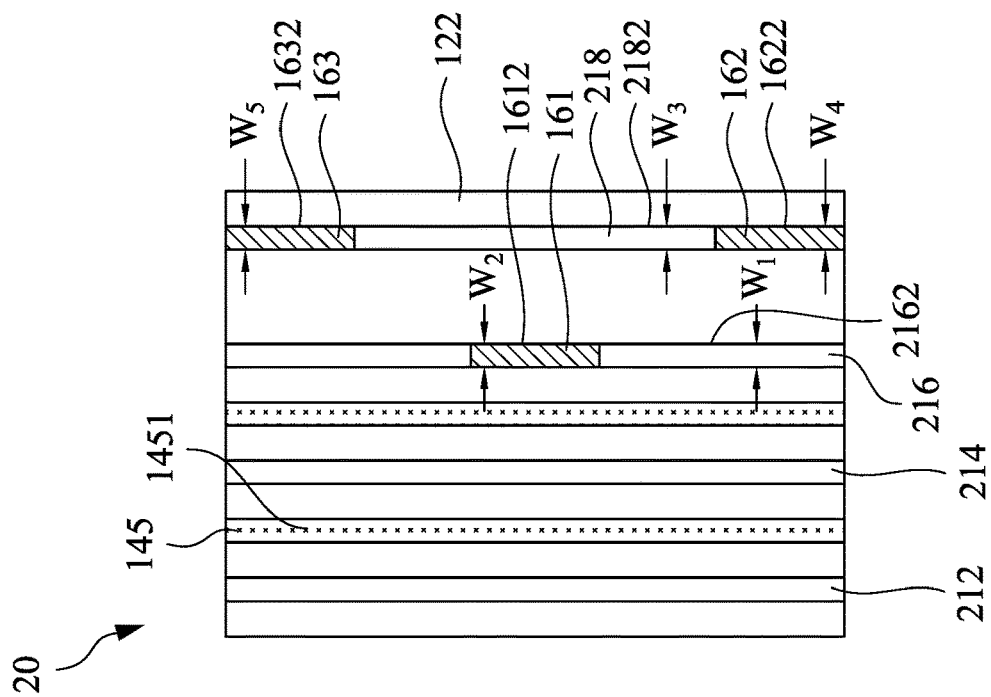
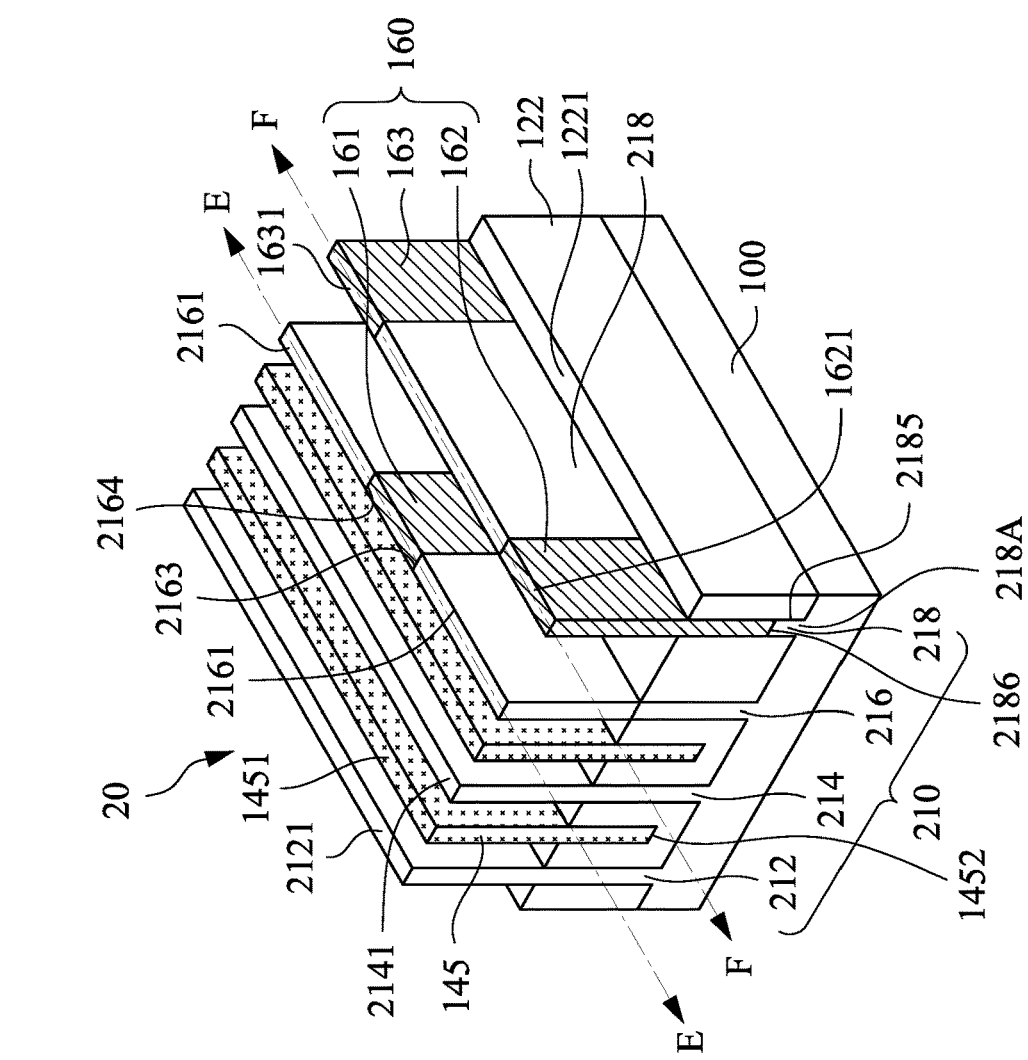
FIG. 8D
FIG. 8C

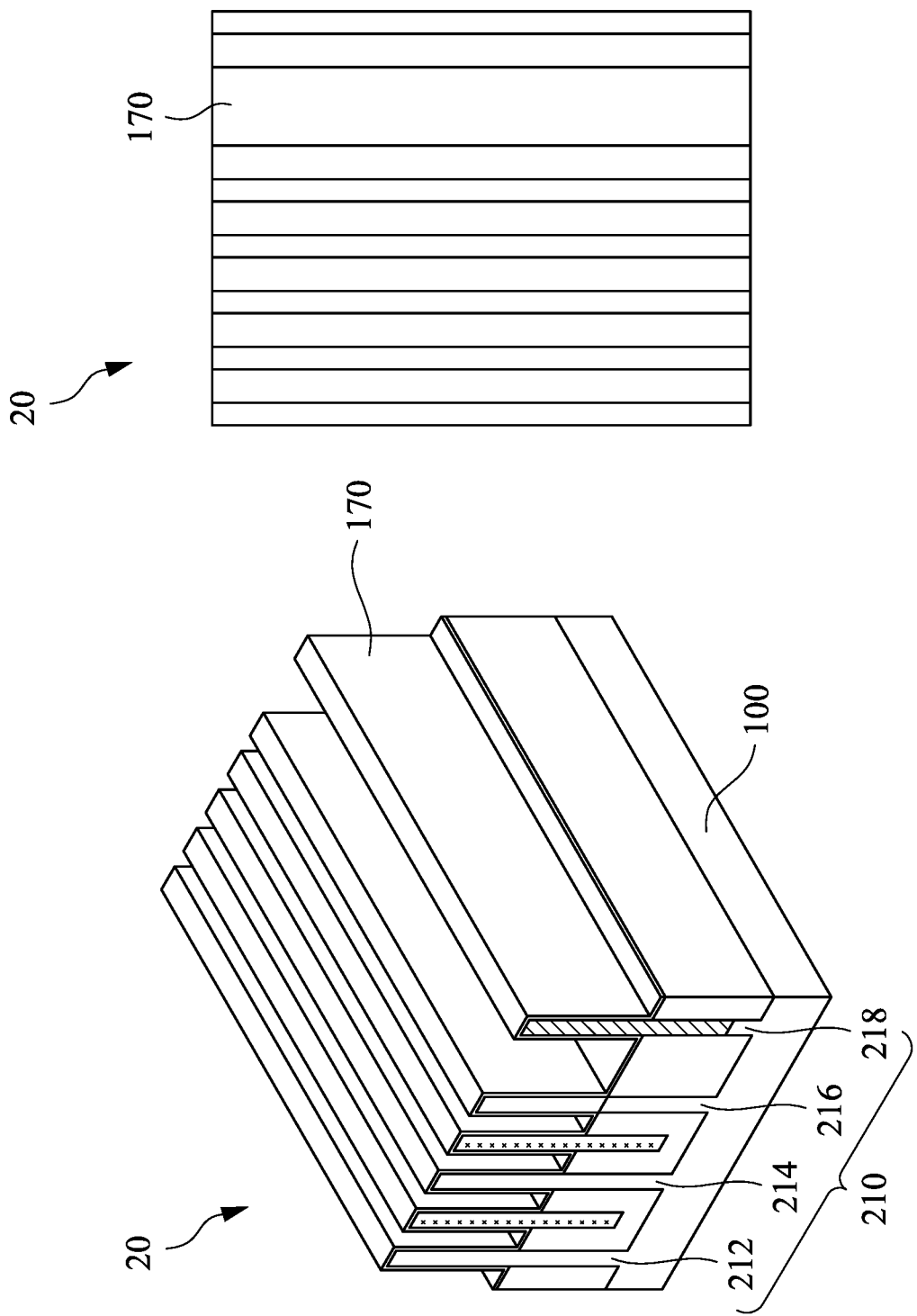

SEMICONDUCTOR DEVICE AND MANUFACTURING METHOD THEREOF

PRIORITY CLAIM AND CROSS-REFERENCE

The present application is a Divisional application of U.S. application Ser. No. 16/713,199, filed on Dec. 13, 2019, now U.S. Pat. No. 11,004,960, issued on May 11, 2021, which is a Continuation application of U.S. application Ser. No. 15/635,337, filed on Jun. 28, 2017, now U.S. Pat. No. 10,510,873, issued on Dec. 17, 2019, which is herein incorporated by reference in its entirety.

BACKGROUND

The semiconductor integrated circuit (IC) industry has experienced rapid growth. In the course of IC evolution, functional density (i.e., the number of interconnected devices per chip area) has increased while geometry size (i.e., the smallest component (or line) that can be created using a fabrication process) has decreased. This scaling down process increases production efficiency and lowers associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 14A are perspective views of a method for manufacturing a semiconductor device at various stages in accordance with some embodiments of the present disclosure.

FIGS. 2B to 14B are top views of FIGS. 2A to 14A, respectively.

FIGS. 2C to 14C are perspective views of a method for manufacturing a semiconductor device at various stages in accordance with some embodiments of the present disclosure.

FIGS. 2D to 14D are top views of FIGS. 2C to 14C, respectively.

DETAILED DESCRIPTION

Figure 1:
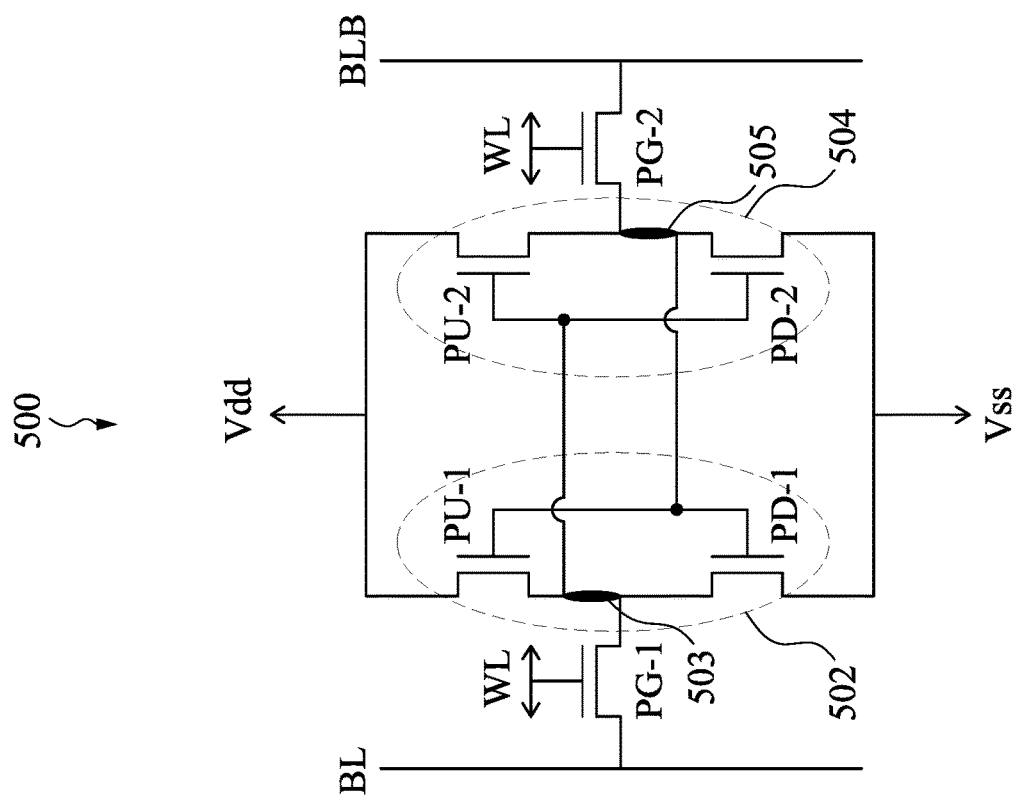
FIG. 1 is a circuit diagram of a six transistor (6T) SRAM cell.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present disclosure will be described with respect to embodiments, a static random-access memory (SRAM) formed of fin field effect transistors (FinFETs). The embodiments of the disclosure may also be applied, however, to a variety of integrated circuits. Various embodiments will be explained in detail with reference to the accompanying drawings.

Static random-access memory (SRAM) is a type of volatile semiconductor memory that uses bistable latching circuitry to store each bit. Each bit in an SRAM is stored on four transistors (PU-1, PU-2, PD-1, and PD-2) that form two cross-coupled inverters. This SRAM cell has two stable states which are used to denote 0 and 1. Two additional access transistors (PG-1 and PG-2) serve to control the access to a storage cell during read and write operations.

FIG. 1 is a circuit diagram of a six transistor (6T) SRAM cell. The SRAM cell 500 includes a first inverter 502 formed by a pull-up transistor PU-1 and a pull-down transistor PD-1. The SRAM cell 500 further includes a second inverter 504 formed by a pull-up transistor PU-2 and a pull-down transistor PD-2. Furthermore, both the first inverter 502 and second inverter 504 are coupled between a voltage bus Vdd and a ground potential Vss. In some embodiments, the pull-up transistor PU-1 and PU-2 can be p-type metal oxide semiconductor (PMOS) transistors while the pull-down transistors PD-1 and PD-2 can be n-type metal oxide semiconductor (NMOS) transistors, and the claimed scope of the present disclosure is not limited in this respect.

In FIG. 1, the first inverter 502 and the second inverter 504 are cross-coupled. That is, the first inverter 502 has an input connected to the output of the second inverter 504. Likewise, the second inverter 504 has an input connected to the output of the first inverter 502. The output of the first inverter 502 is referred to as a storage node 503. Likewise, the output of the second inverter 504 is referred to as a storage node 505. In a normal operating mode, the storage node 503 is in the opposite logic state as the storage node 505. By employing the two cross-coupled inverters, the SRAM cell 500 can hold the data using a latched structure so that the stored data will not be lost without applying a refresh cycle as long as power is supplied through Vdd.

In an SRAM device using the GT SRAM cells, the cells are arranged in rows and columns. The columns of the SRAM array are formed by a bit line pairs, namely a first bit line BL and a second bit line BLB. The cells of the SRAM device are disposed between the respective bit line pairs. As shown in FIG. 1, the SRAM cell 500 is placed between the bit line BL and the bit line BLB.

In FIG. 1, the SRAM cell 500 further includes a first pass-gate transistor PG-1 connected between the bit line BL and the output 503 of the first inverter 502. The SRAM cell 500 further includes a second pass-gate transistor PG-2 connected between the bit line BLB and the output 505 of the second inverter 504. The gates of the first pass-gate transistor PG-1 and the second pass-gate transistor PG-2 are connected to a word line WL, which connects SRAM cells in a row of the SRAM array.

In operation, if the pass-gate transistors PG-1 and PG-2 are inactive, the SRAM cell 500 will maintain the complementary values at storage nodes 503 and 505 indefinitely as long as power is provided through Vdd. This is so because each inverter of the pair of cross coupled inverters drives the input of the other, thereby maintaining the voltages at the storage nodes. This situation will remain stable until the power is removed from the SRAM, or, a write cycle is performed changing the stored data at the storage nodes.

In the circuit diagram of FIG. 1, the pull-up transistors PU-1, PU-2 are p-type transistors. The pull-down transistors PD-1, PD-2, and the pass-gate transistors PG-1, PG-2 are n-type transistors. According to various embodiments, the pull-up transistors PU-1, PU-2, the pull-down transistors PD-1, PD-2, and the pass-gate transistors PG-1, PG-2 can be implemented by FinFETs.

The structure of the SRAM cell 500 in FIG. 1 is described in the context of the 6T-SRAM. One of ordinary skill in the art, however, should understand that features of the various embodiments described herein may be used for forming other types of devices, such as an 8T-SRAM memory device, or memory devices other than SRAMs. Furthermore, embodiments of the present disclosure may be used as stand-alone memory devices, memory devices integrated with other integrated circuitry, or the like. Accordingly, the embodiments discussed herein are illustrative of ways to make and use the disclosure, and do not limit the scope of the disclosure.

FIGS. 2A to 14A are perspective views of a method for manufacturing a semiconductor device at various stages in accordance with some embodiments of the present disclosure. FIGS. 2B to 14B are top views of FIGS. 2A to 14A, respectively. FIGS. 2C to 14C are perspective views of a method for manufacturing a semiconductor device at various stages in accordance with some embodiments of the present disclosure. FIGS. 2D to 14D are top views of FIGS. 2C to 14C, respectively.

Figure 2B:
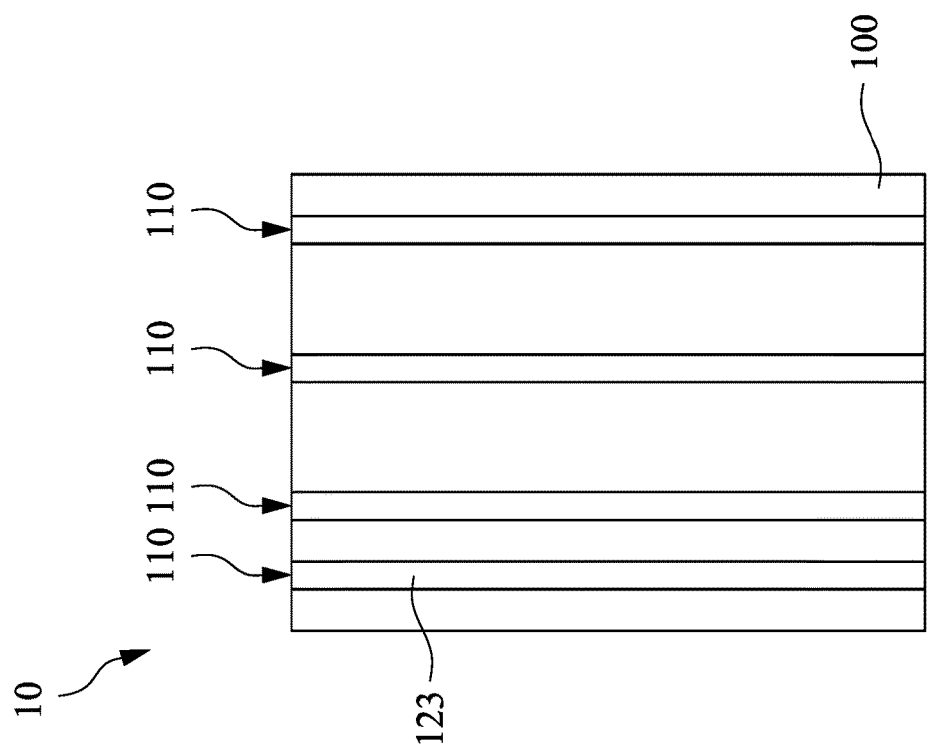
Figure 2A:
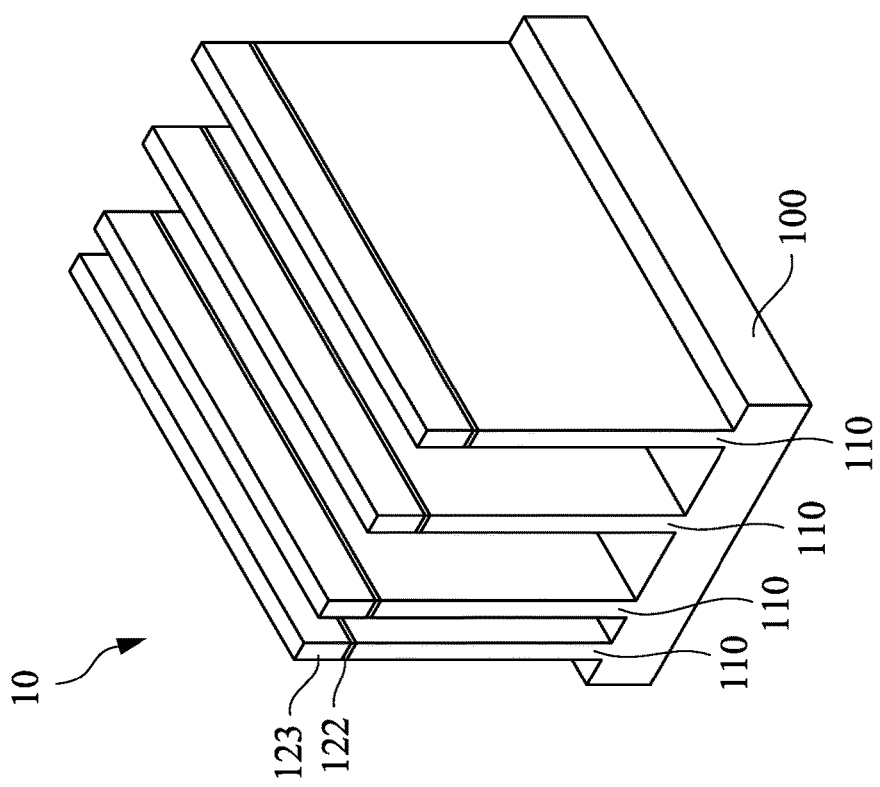
Figure 2D:
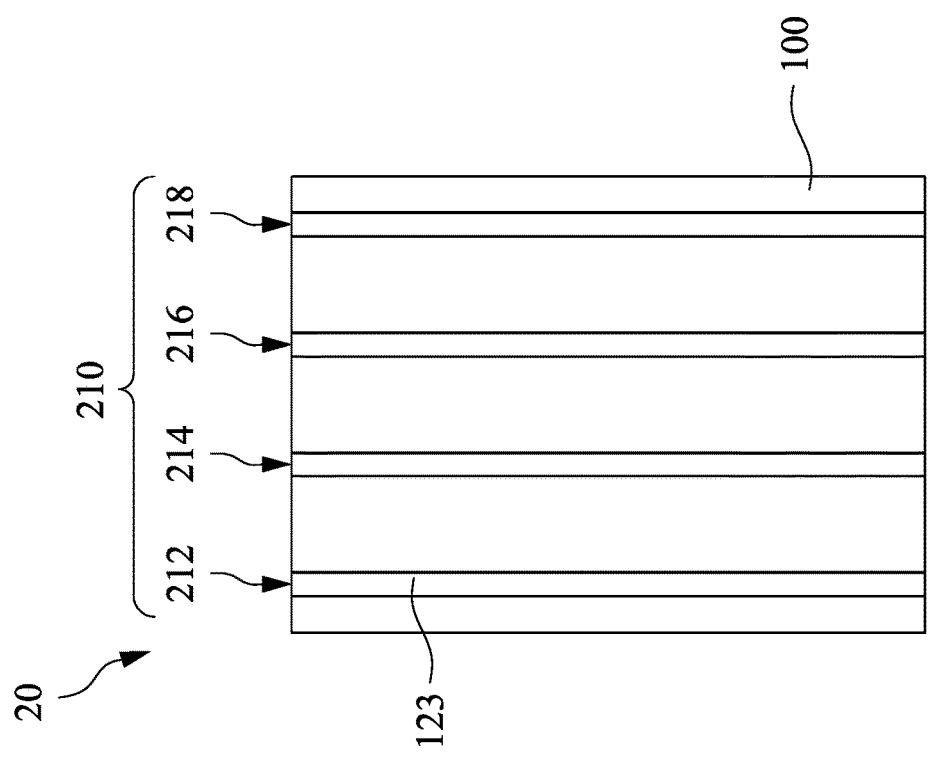
Figure 2C:
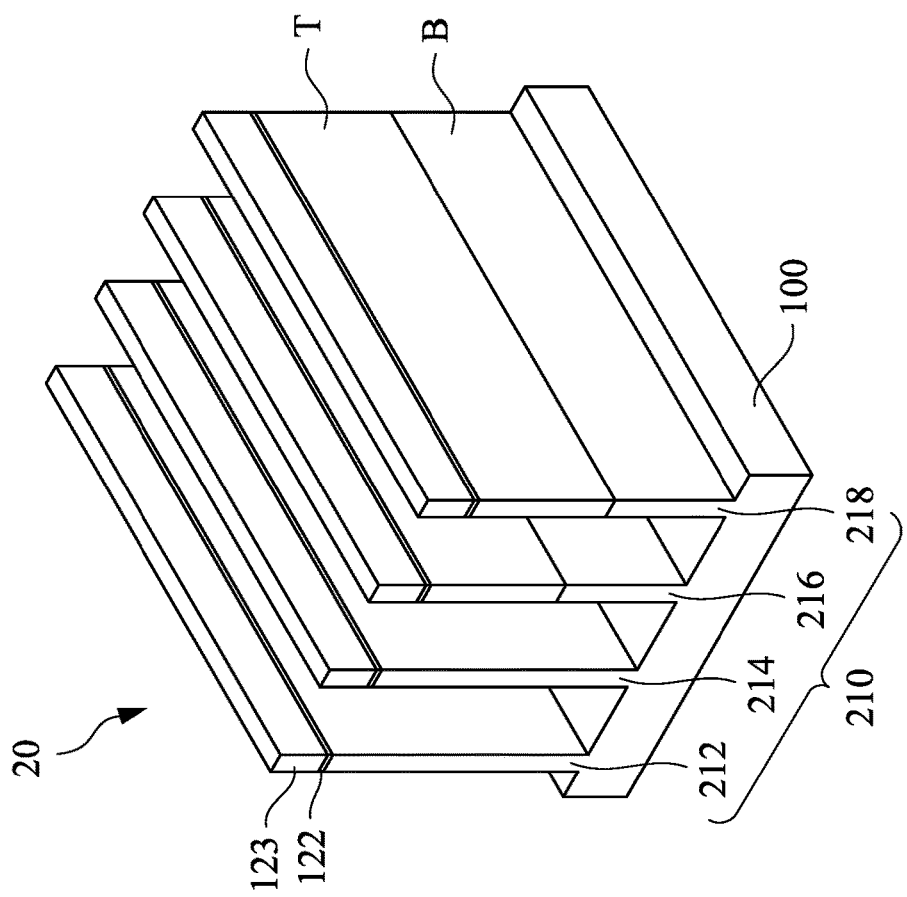
Figure 3D:
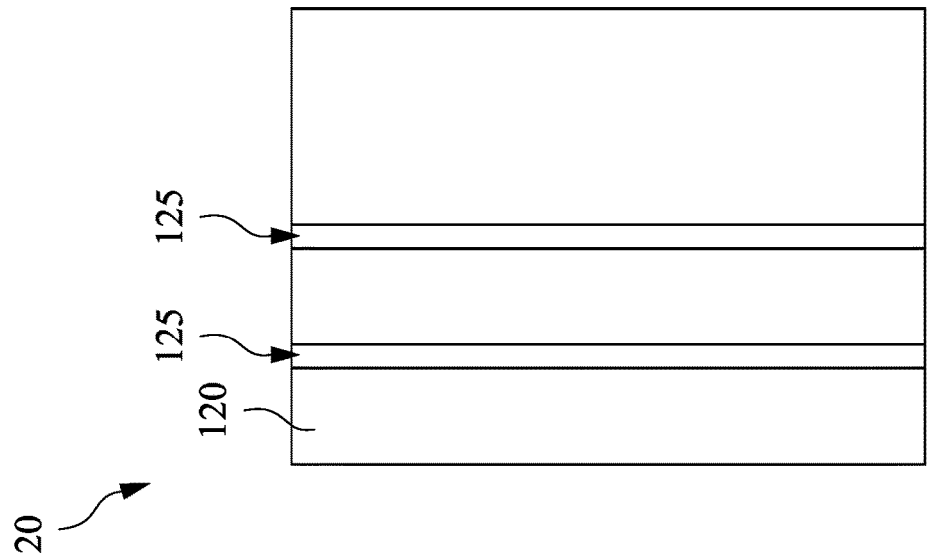
Figure 3C:
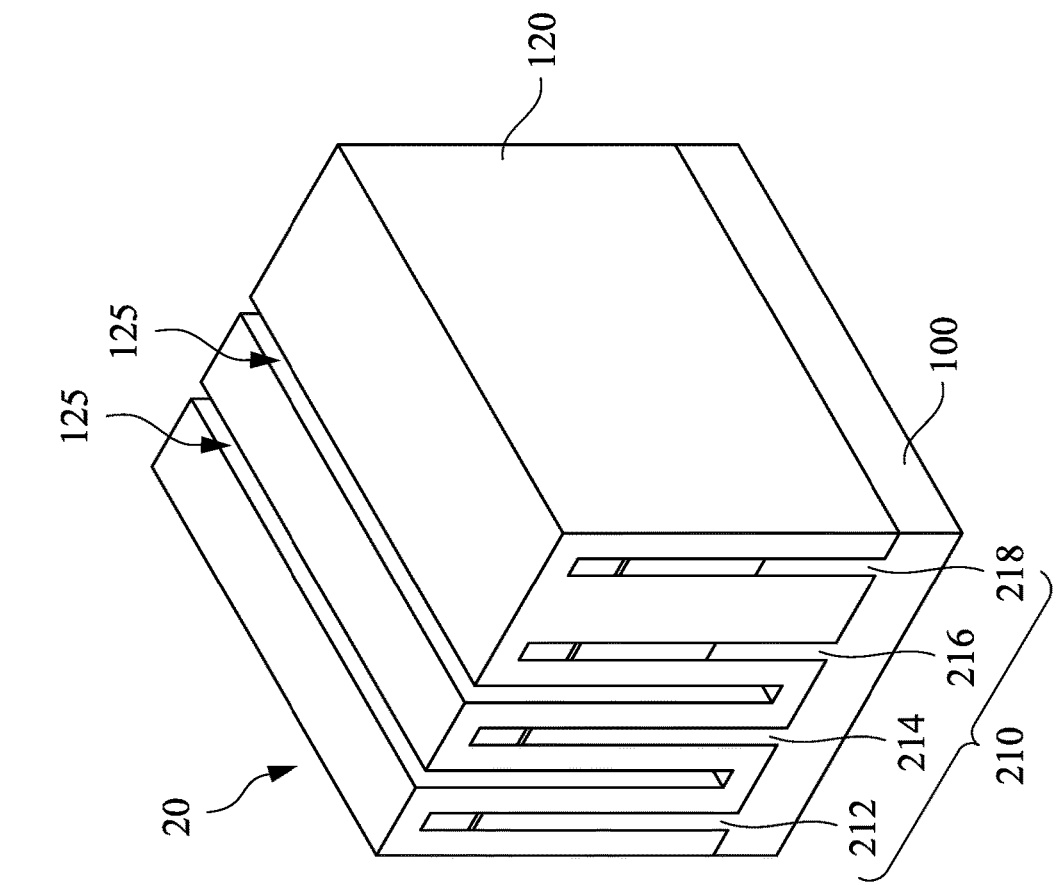
Figure 4B:
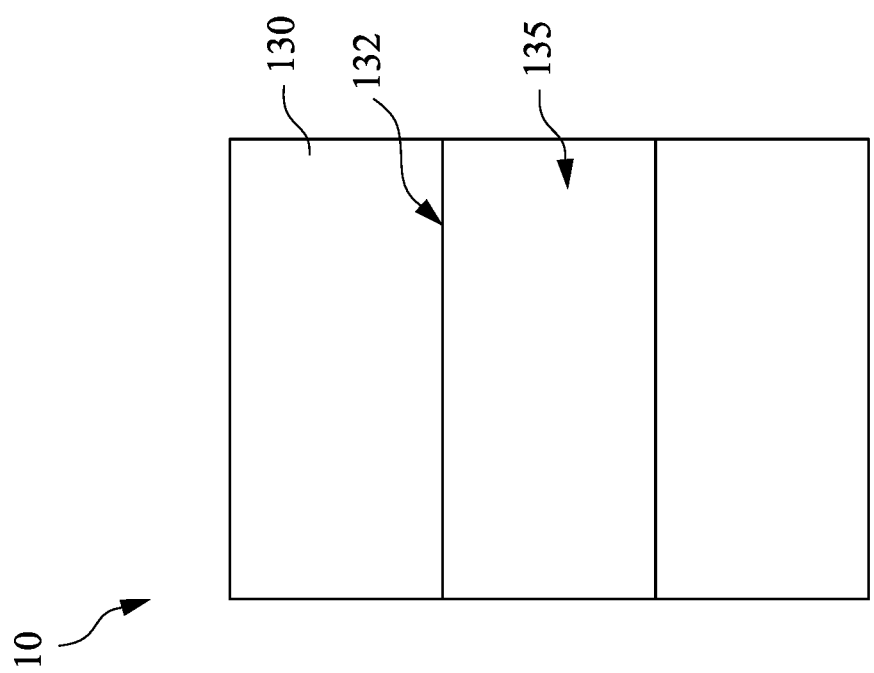
Figure 4A:
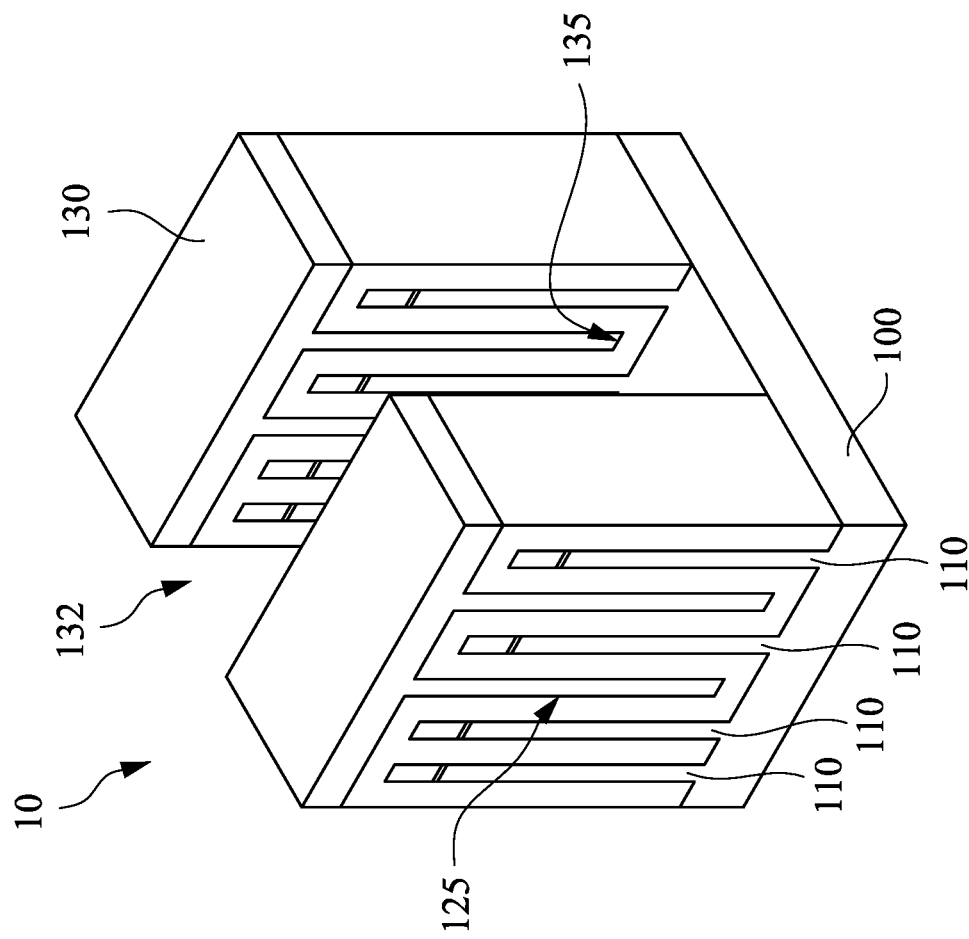
Figure 4D:
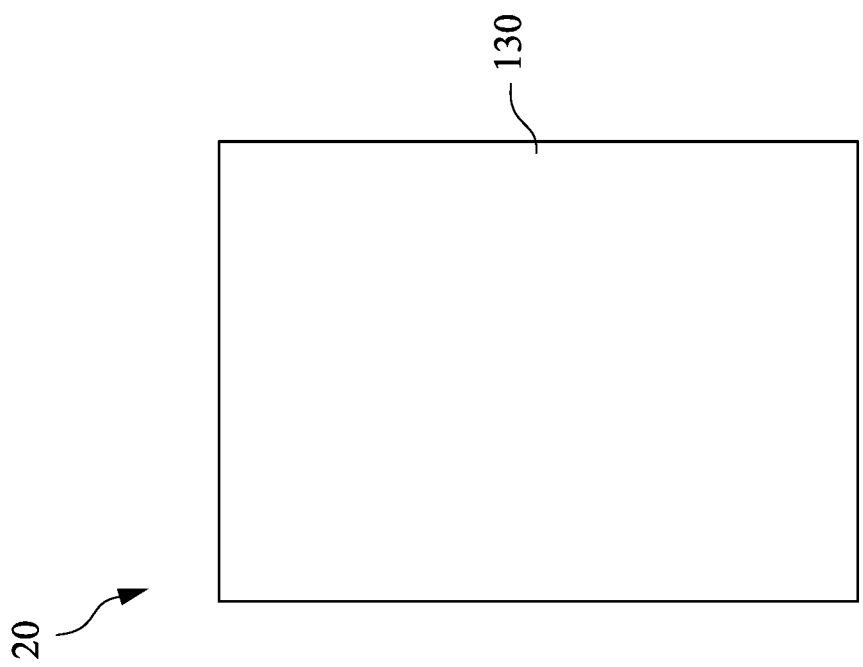
Figure 4C:
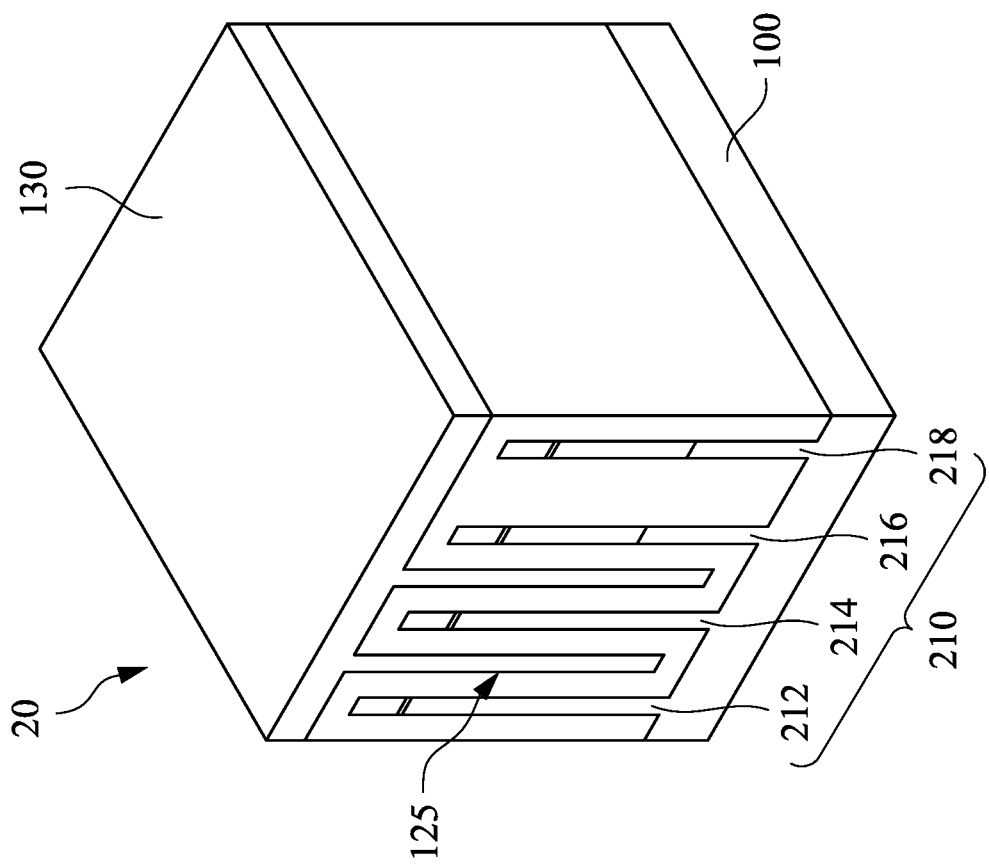

Reference is made to FIGS. 2A to 2D. The semiconductor device includes a logic circuit region and an SRAM circuit region. In the following description, the logic circuit region is referred to as LOGIC region 10, and the SRAM circuit region is referred to as SRAM region 20. FIGS. 2A and 2B illustrate the LOGIC region 10 of the semiconductor device to be formed, and FIGS. 2C and 2D illustrate the SRAM region 20 of the semiconductor device to be formed.

A substrate 100 is provided. It is noted that, in some embodiments, the LOGIC region 10 and the SRAM region 20 are formed on the same semiconductor device. That is, the substrates 100 respectively described in FIGS. 2A and 2C are different regions of the same substrate. However, in some other embodiments, the LOGIC region 10 and the SRAM region 20 of the semiconductor device may also be formed on different substrates.

The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

The doped regions may be doped with p-type dopants, such as boron or $BF_2$; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

Semiconductor fins 110 are formed over the substrate 100 within the LOGIC region 10, and semiconductor fins 210 are formed over the substrate 100 within the SRAM region 20. The semiconductor fins 210 include semiconductor fins 212, 214, 216, and 218. In some embodiments, the semiconductor fins 212 and 214 may be the same type, and the fins 216 and 218 may be the same type. For example, the fins 212 and 214 are n-type semiconductor fins, and the fins 216 and 218 are p-type semiconductor fins. In FIG. 2C, at least one of the fins 216 and 218 includes a bottom portion B and a top portion T disposed on the bottom portion B. The bottom portion B and the top portion T are made of different materials. For example, the bottom portion B is made of silicon, and the top portion T is made of SiGe, and the present disclosure is not limited in this respect.

In some embodiments, a pad layer 122 and a mask layer 123 are disposed on the semiconductor fins 110 and 210. In some embodiments, the pad layer 122 may be a thin film comprising silicon oxide formed, for example, using a thermal oxidation process. The pad layer 122 may act as an adhesion layer between the semiconductor fins 110, 210 and the mask layer 123. In some embodiments, the mask layer 123 is formed of silicon nitride, for example, using low-pressure chemical vapor deposition (LPCVD) or plasma enhanced chemical vapor deposition (PECVD). The mask layer 123 is used as a hard mask during following processes, such as photolithography.

The semiconductor fins 110 and 210 may be formed by suitable method. For example, a pad layer and a mask layer may be blanketed over the substrate 100. A patterned photo-sensitive layer is formed over the substrate 100. Then, the pad layer, the mask layer, and the substrate 100 may be patterned using one or more photolithography processes with the patterned photo-sensitive layer, including double-patterning or multi-patterning processes, to form the pad layer 122, the mask layer 123, and the semiconductor fins 110 and 210.

Reference is made to FIGS. 3A to 3D. An isolation layer 120 is formed over the substrate 100. In some embodiments, the isolation layer 120 is formed to conformally cover the semiconductor fins 110 and 210 by suitable deposition process, such as atomic layer deposition (ALD). Thus, plural trenches 125 are formed in the isolation layer 120 and between the semiconductor fins 110 and 210. For example, some trenches 125 are formed between the fins 110, and some other trenches 125 are formed between the fins 212 and 214. In some embodiments, a thickness of the isolation layer 120 is about 12 nm to about 19 nm, and the present disclosure is not limited in this respect.

However, in some embodiments, if two adjacent fins are too close, the isolation layer 120 may be filled in the space between the fins. For example, in FIG. 3C, since the semiconductor fins 216 and 218 are close enough, the isolation layer 120 is filled in the space between the semiconductor fins 216 and 218. That is, no trench is formed between the semiconductor fins 216 and 218. Similar structures also presents in some of the semiconductor fins 110 within the LOGIC region 10, and are not repeated herein for simplicity.

Reference is made to FIGS. 4A to 4D. A patterned mask layer 130 is formed over the substrate 100 and covers the isolation layer 120. The mask layer 130 is filled in the trenches 125 in the isolation layer 120. In some embodiments, the mask layer 130 includes an opening 132 that exposes parts of isolation layer 120 within the LOGIC region 10. State differently, the opening 132 exposes parts of the semiconductor fins 110 covered by the isolation layer 120. One or more etching process(es) are performed through the opening 132 to remove parts of the semiconductor fins 110 and the isolation layer 120 through the opening 132. As a result, a recess 135 is formed over the substrate 100 within the LOGIC region 10, in which the recess 135 exposes parts of the substrate 100 within the LOGIC region 10. At this stage, the SRAM region 20 is covered by the mask layer 130.

In some embodiments, the etching process may include dry etching process, wet etching process, and/or combination thereof. The recessing process may also include a selective wet etch or a selective dry etch. A wet etching solution includes a tetramethylammonium hydroxide (TMAH), a HF/HNO$_3$/CH$_3$COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH$_4$OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include CF$_4$, NF$_3$, SF$_6$, and He. Dry etching may also be performed anisotropically using such mechanisms as DRIE (deep reactive-ion etching).

Figure 5B:
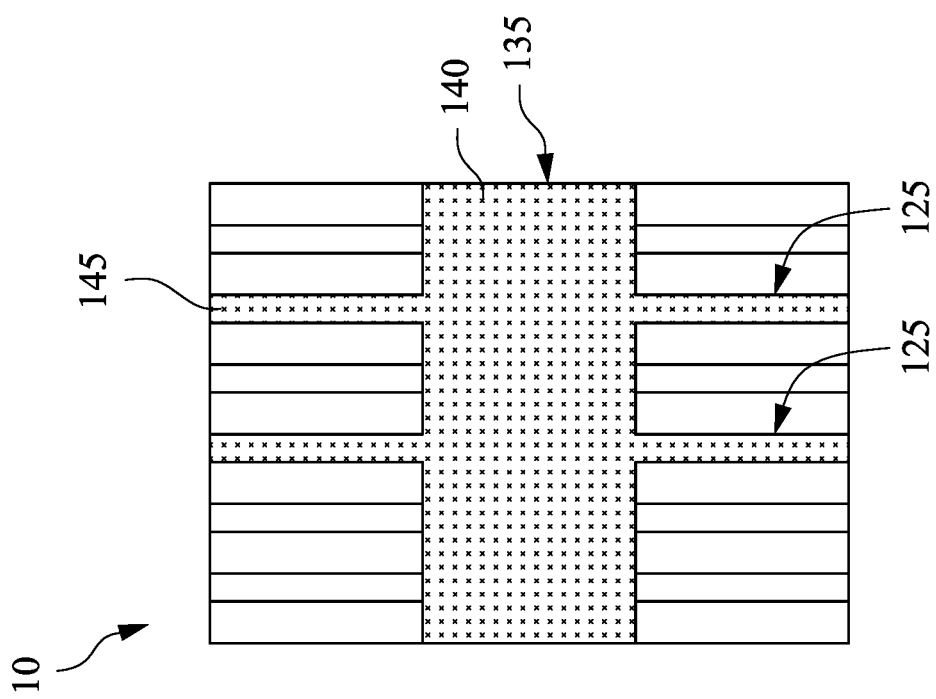
Figure 5A:
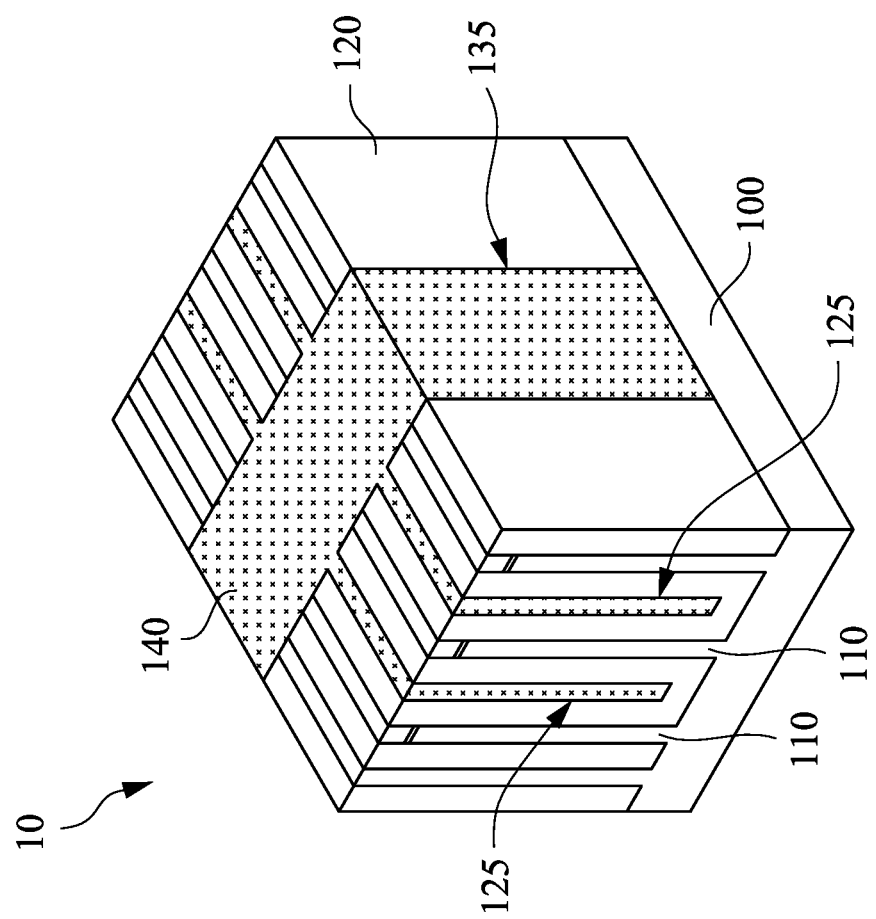
Figure 5D:
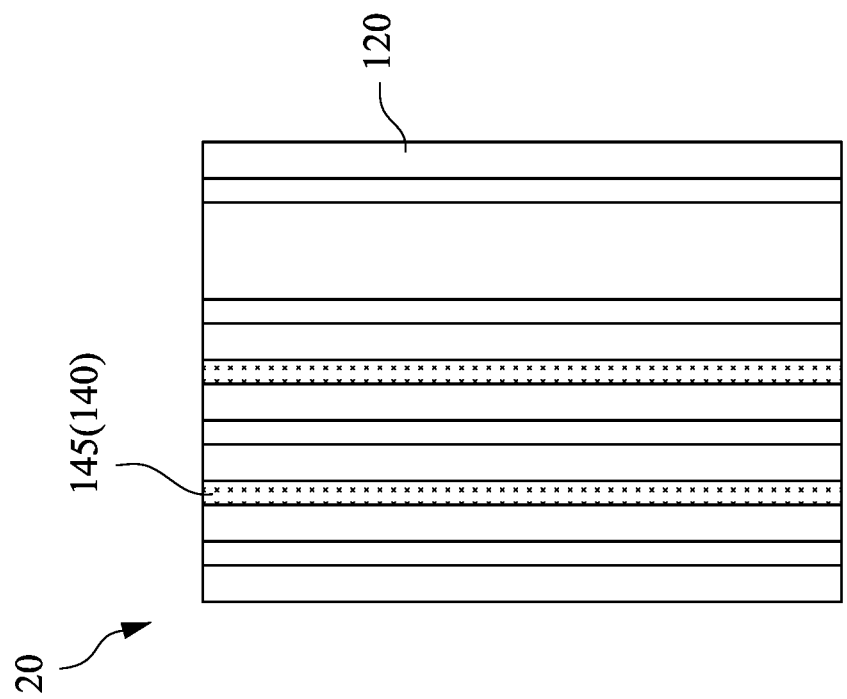
Figure 5C:
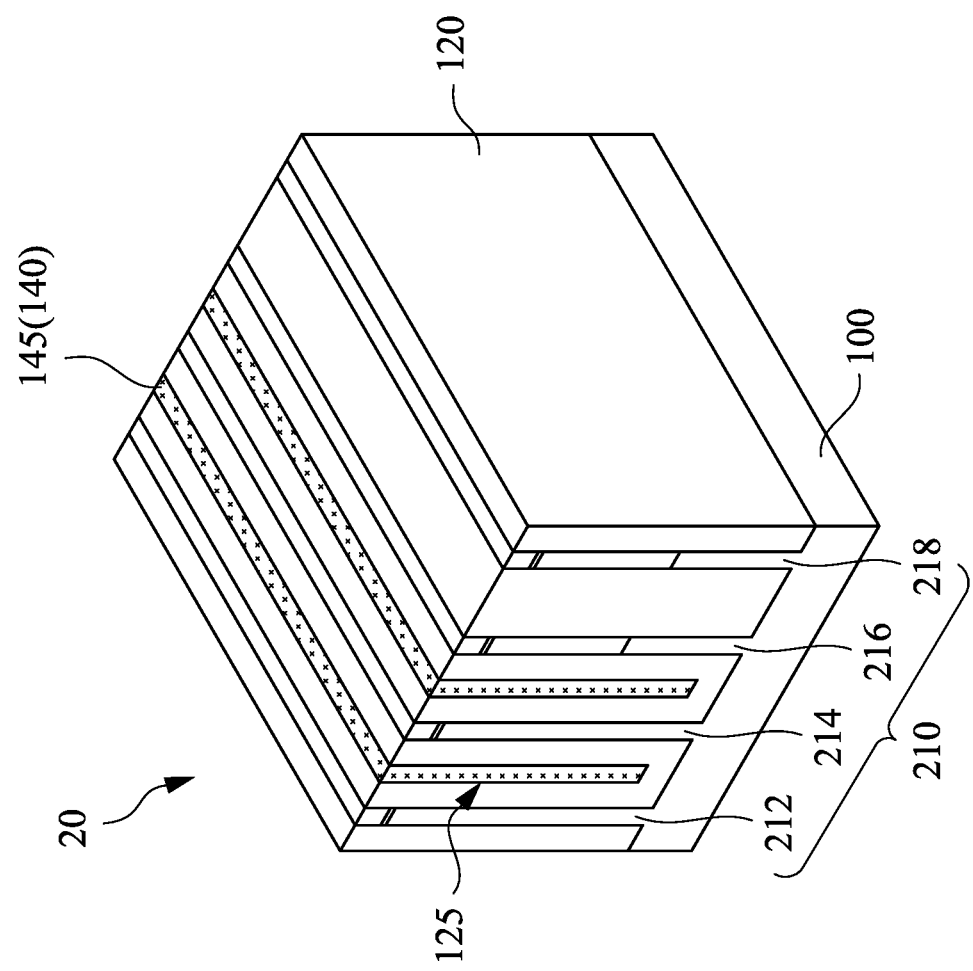
Figure 6B:
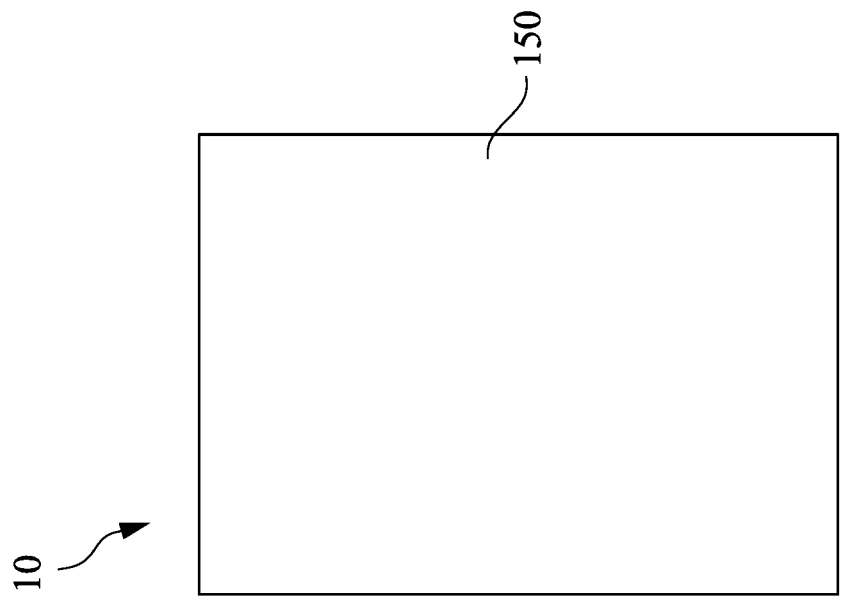
Figure 6A:
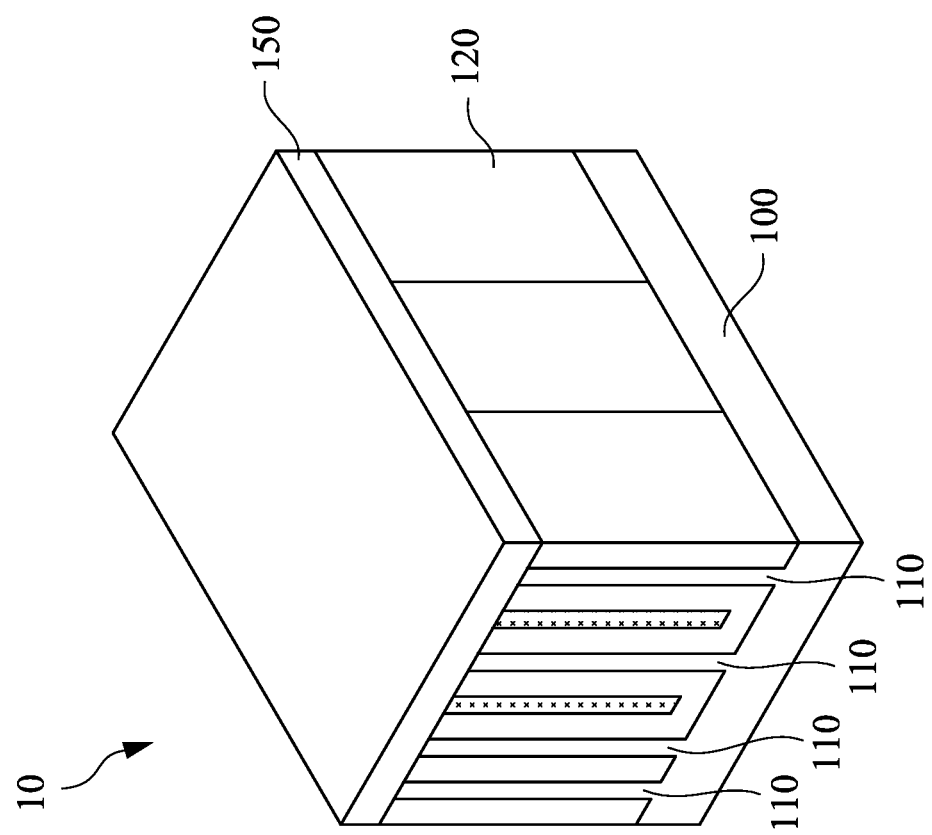
Figure 6D:
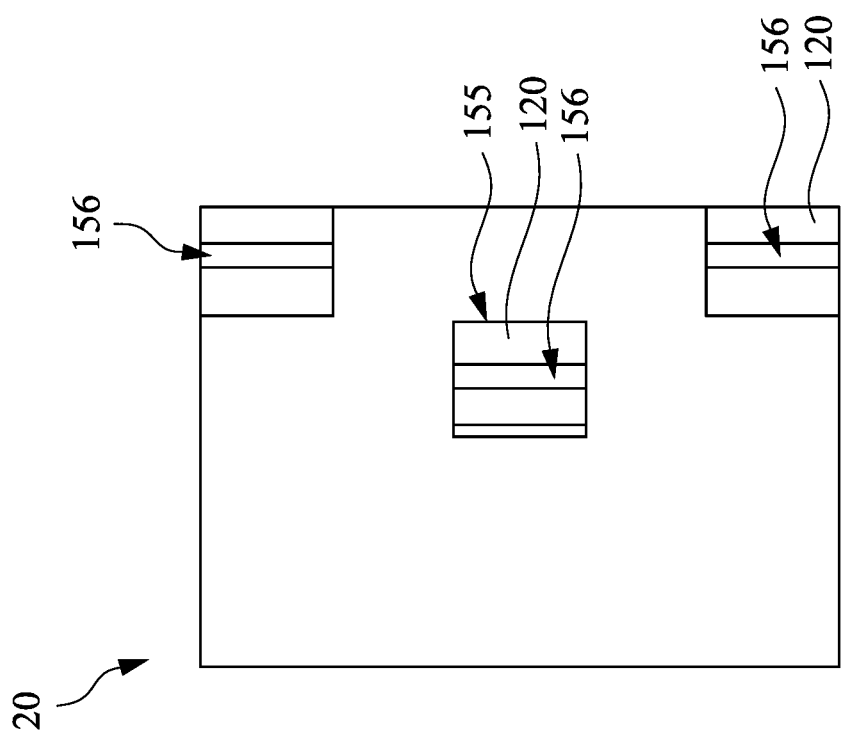
Figure 6C:
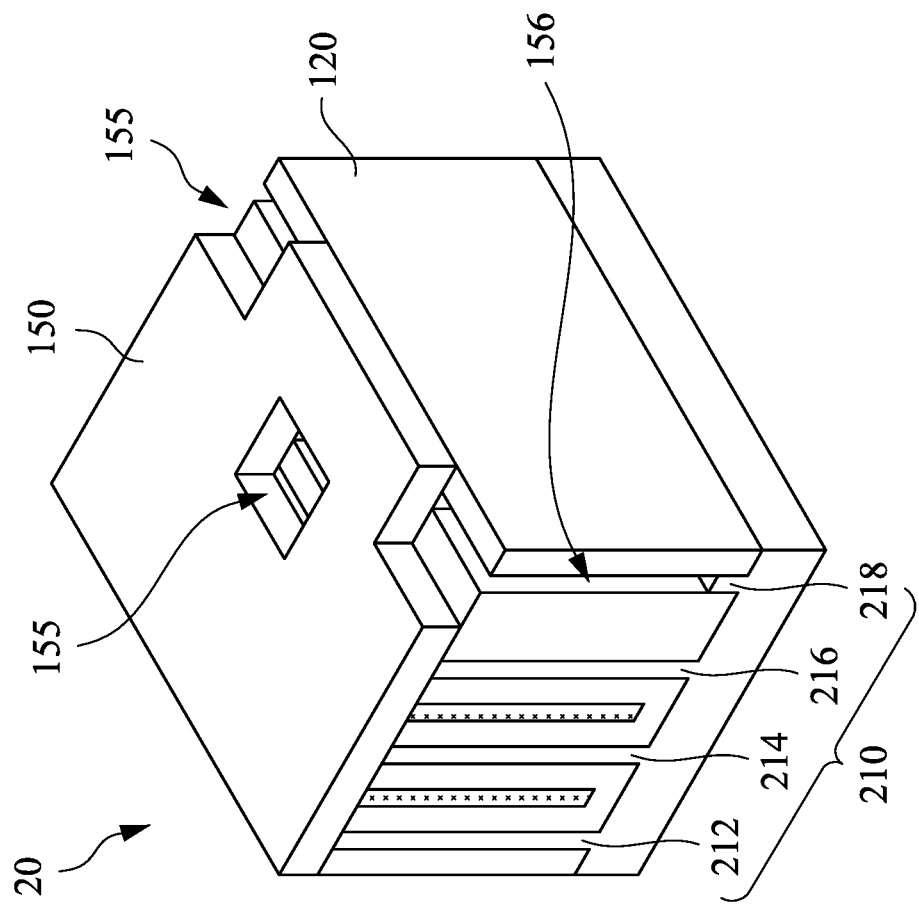
Figure 7B:
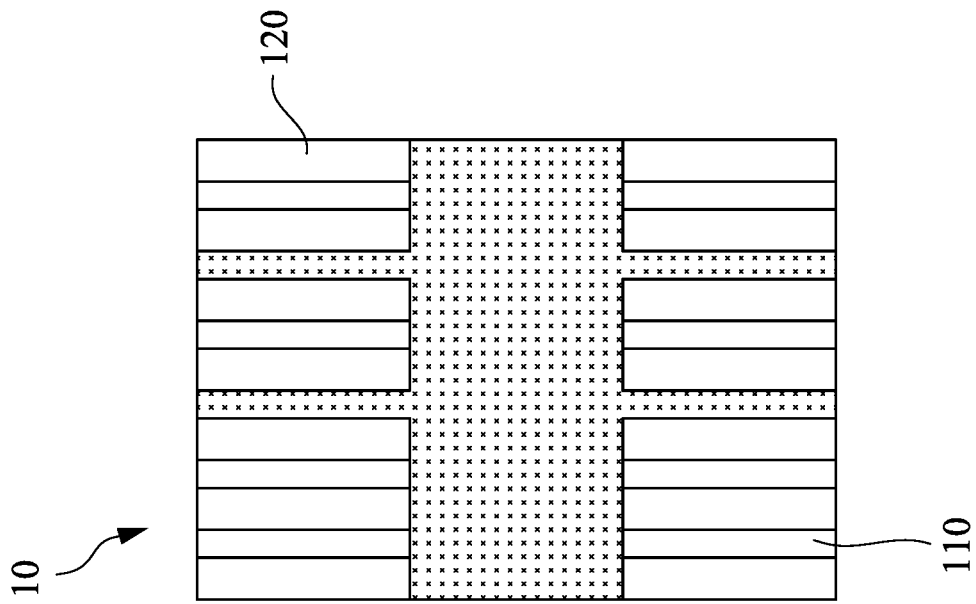
Figure 7A:
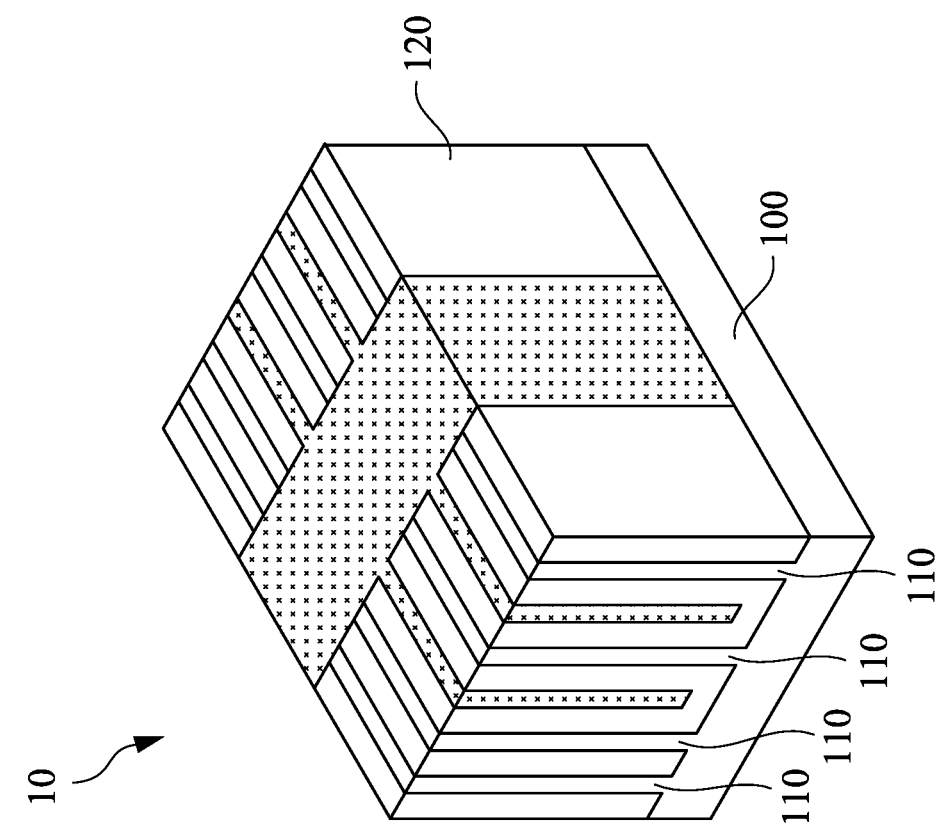
Figure 7D:
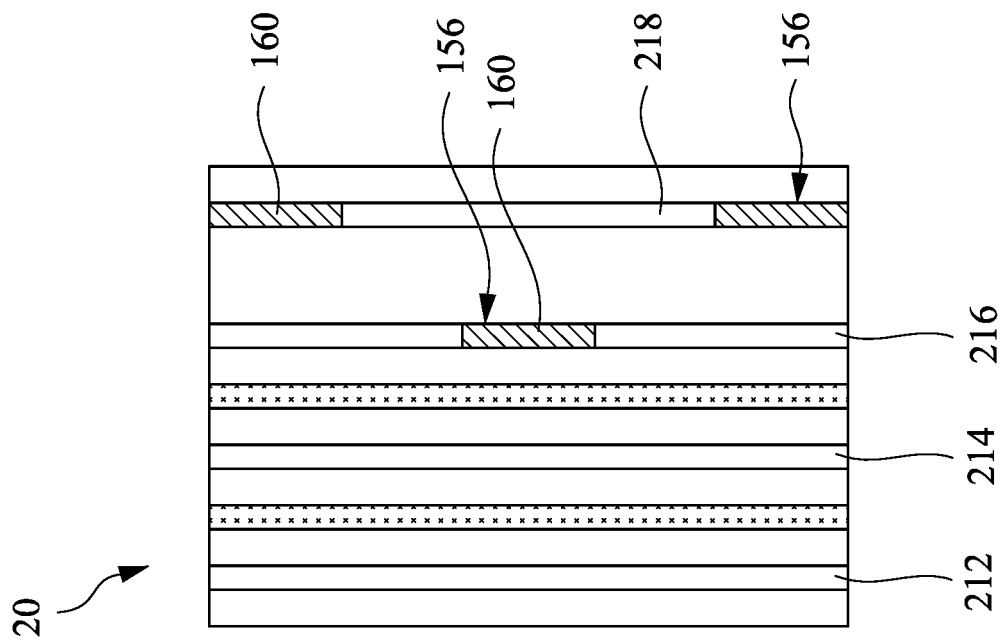
Figure 7C:
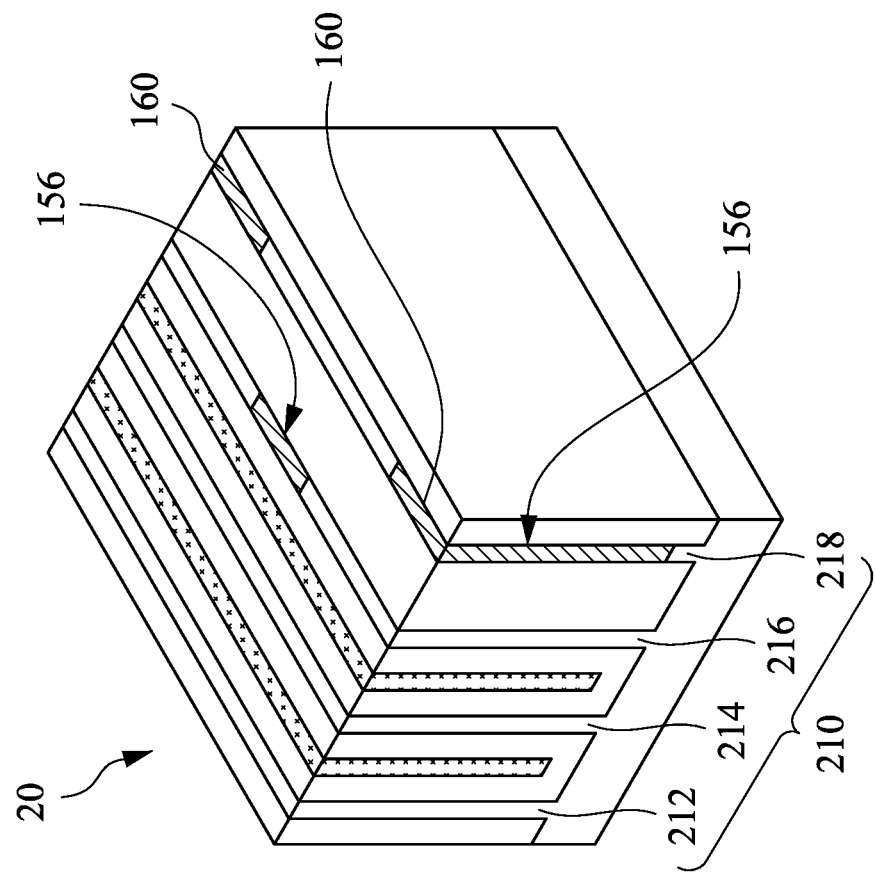

Reference is made to FIGS. 5A to 5D. The mask layer 130 of FIGS. 4A to 4D is removed. Accordingly, the trenches 125 are exposed. Then, a dielectric layer 140 is formed over the substrate 100 and filling the trenches 125 and the recess 135. In some embodiments, the portions of the dielectric layer 140 filled in the trenches 125 may be referred to as dummy fins 145. The dummy fins 145 are formed between some of the semiconductor fins 110 and 210. For example, a dummy fin 145 is formed between the semiconductor fins 212 and 214, and another dummy fin 145 is formed between the semiconductor fins 214 and 216, as shown in FIG. 5C.

In some embodiments, the dielectric layer 140 may include silicon nitride (SiN), oxynitride, silicon carbon (SiC), silicon oxynitride (SiON), oxide, SiO$_2$, Si$_3$N$_4$, SiOCN, and the like and may be formed by methods utilized to form such a layer, such as CVD, plasma enhanced CVD, sputter, and other methods known in the art.

Reference is made to FIGS. 6A to 6D. A mask layer 150 is formed over the substrate 100 and covers the isolation layer 120 and the dielectric layer 140. The mask layer 150 includes plural openings 155 that expose parts of the isolation layer 120, and parts of the semiconductor fins 216 and 218. One or more etching process(es) are performed to remove the exposed portions of the semiconductor fins 216 and 218. As a result, plural recesses 156 are formed in the isolation layer 120. At this stage, the LOGIC region 10 is covered by the mask layer 150. The recesses 156 are defined by the patterned semiconductor fins 210 and the isolation layer 120.

Reference is made to FIGS. 7A to 7D. The mask layer 150 of FIGS. 6A to 6D is removed. A dielectric layer 160 is formed over the substrate 100 and filling the recesses 156. Then, a CMP process is performed to remove the excessive dielectric layer 160 until the semiconductor fins 110 and 210 are exposed. From other perspectives, the removed portions of the semiconductor fins 216 and 218 are replaced by the dielectric layer 160, and the dielectric layer 160 carries the substantially original shapes of the semiconductor fins 216 and 218. Thus, the dielectric layer 160 in the recesses 156 may also be referred to as dielectric fins 160. The dielectric fins 160 may include dielectric material, such as silicon nitride (SiN), oxynitride, silicon carbon (SiC), silicon oxynitride (SiON), oxide, SiO$_2$, Si$_3$N$_4$, SiOCN.

Figure 8B:
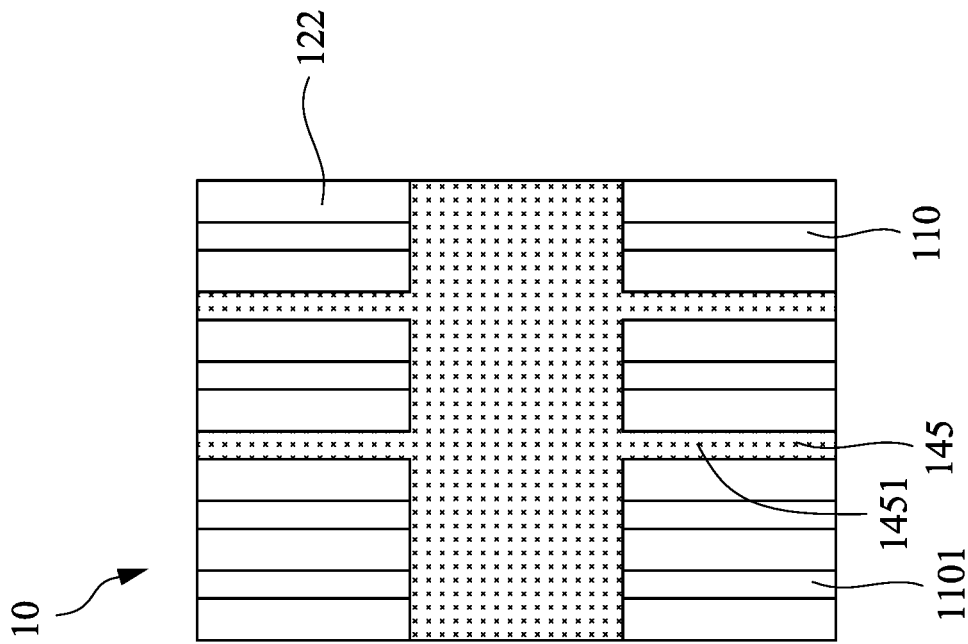
Figure 8A:
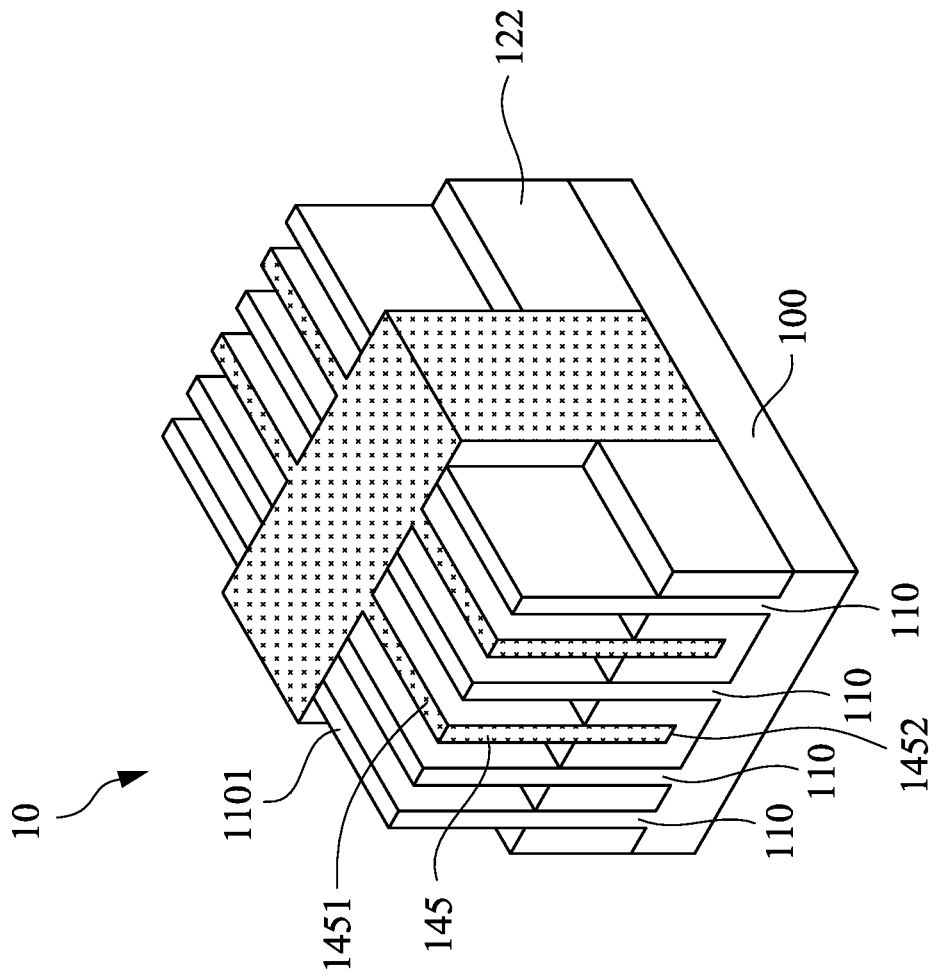
Figure 8F:
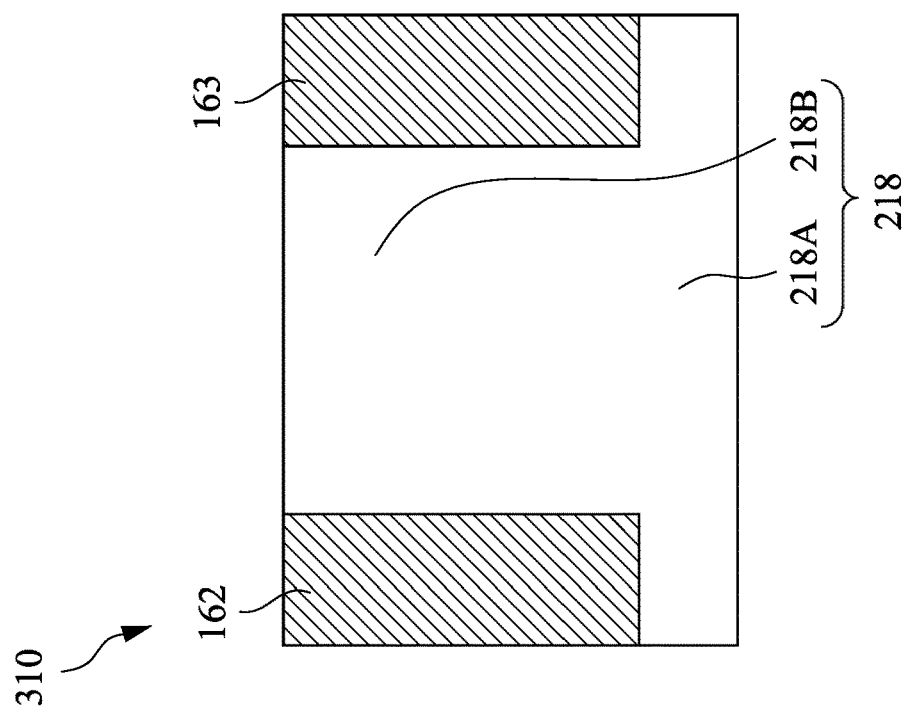
FIG. 8F is a cross-sectional view cut from line F-F of FIG. 8C.
Figure 8E:
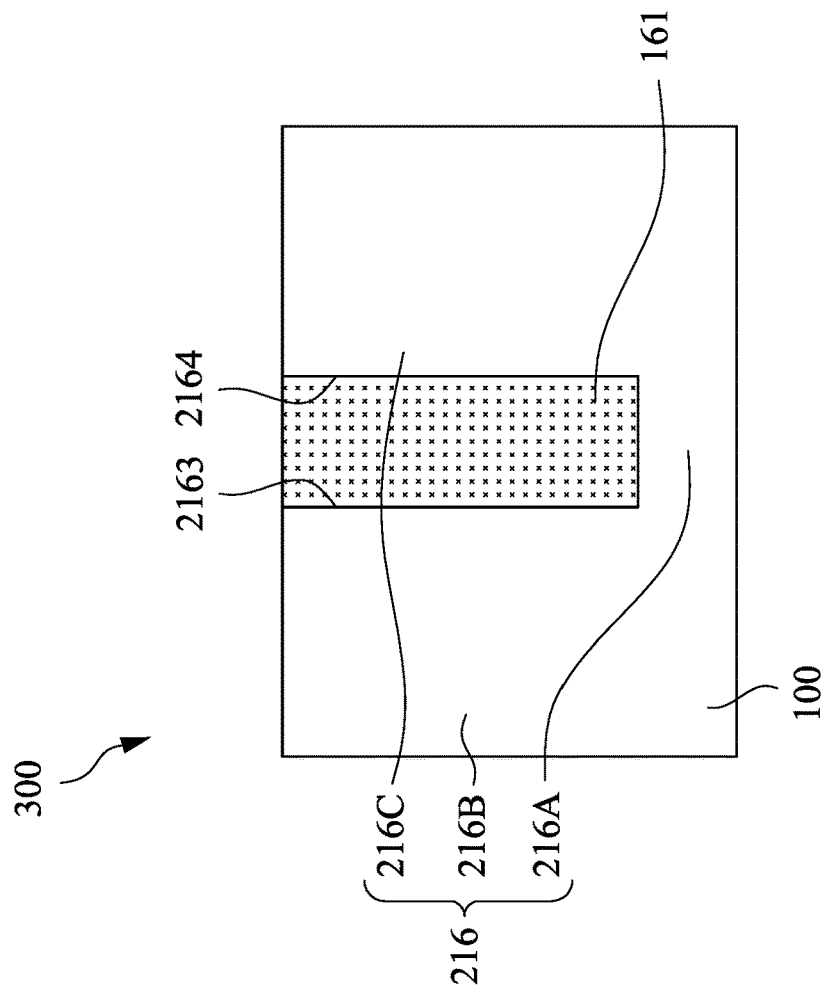
FIG. 8E is a cross-sectional view cut from line E-E of FIG. 8C.
Figure 9B:
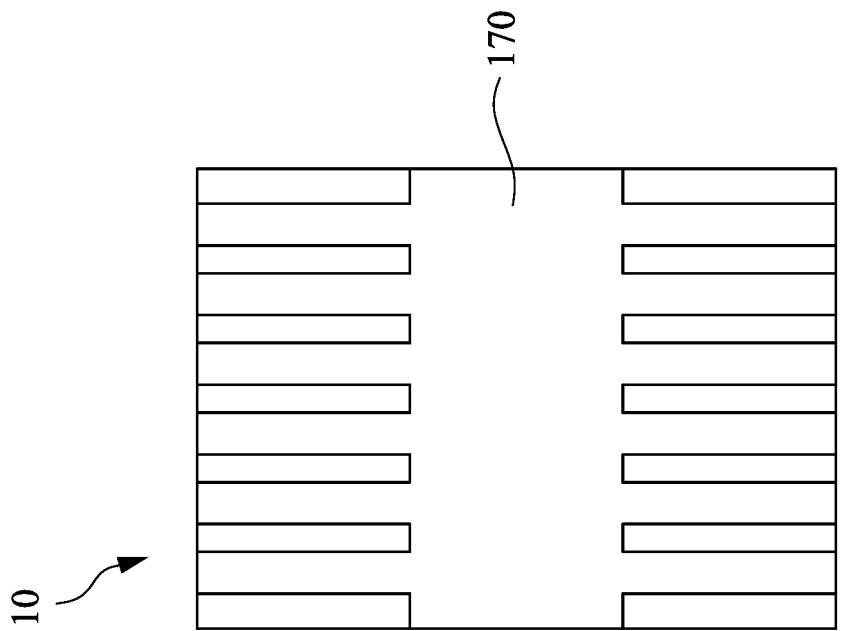
Figure 9A:
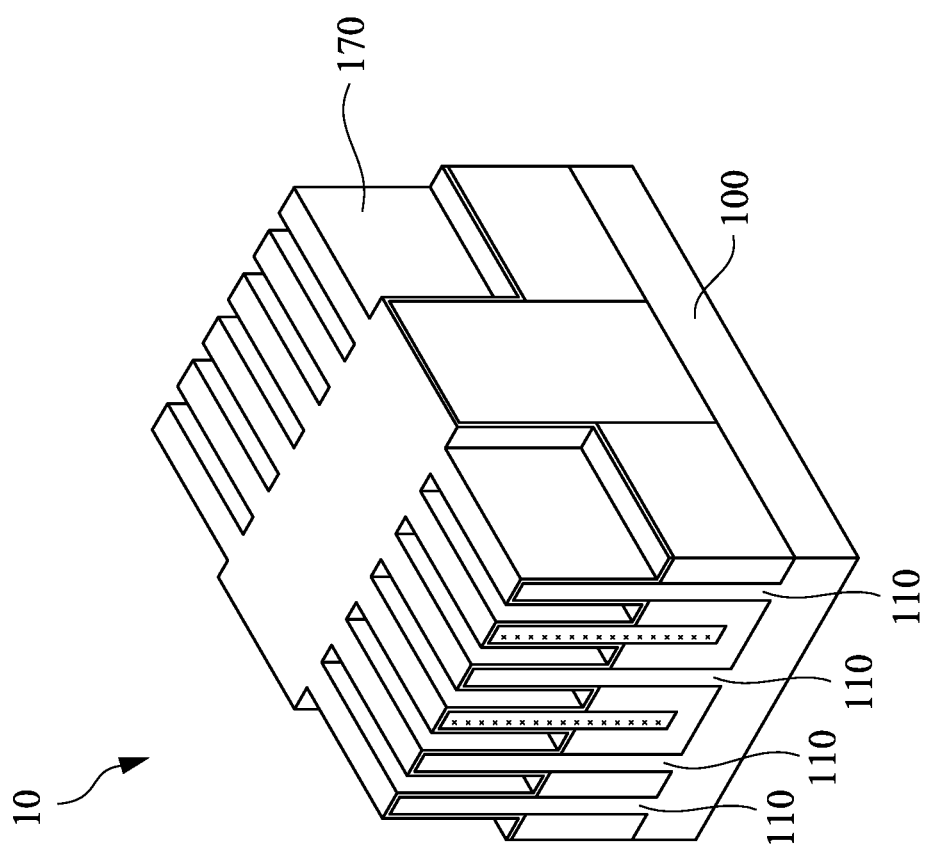
Figure 10B:
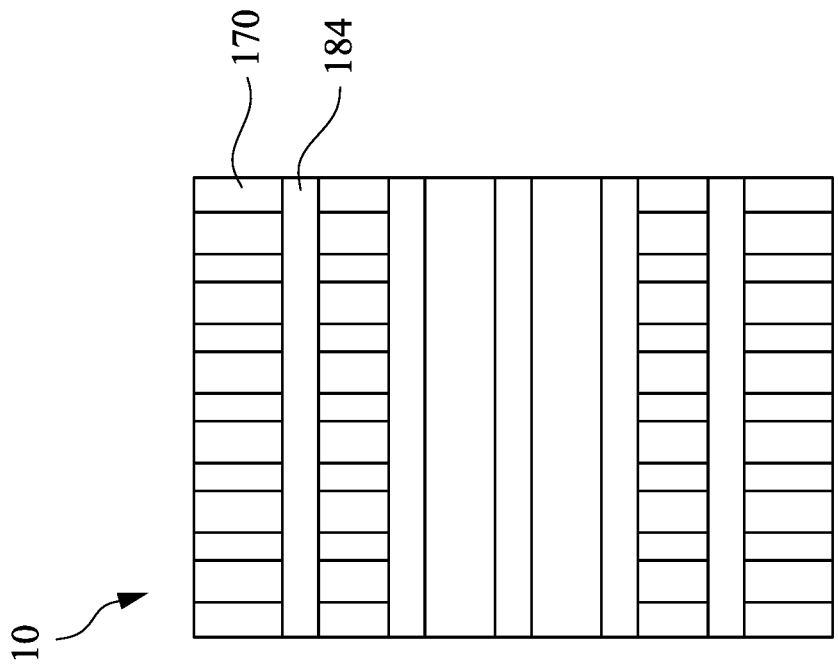
Figure 10A:
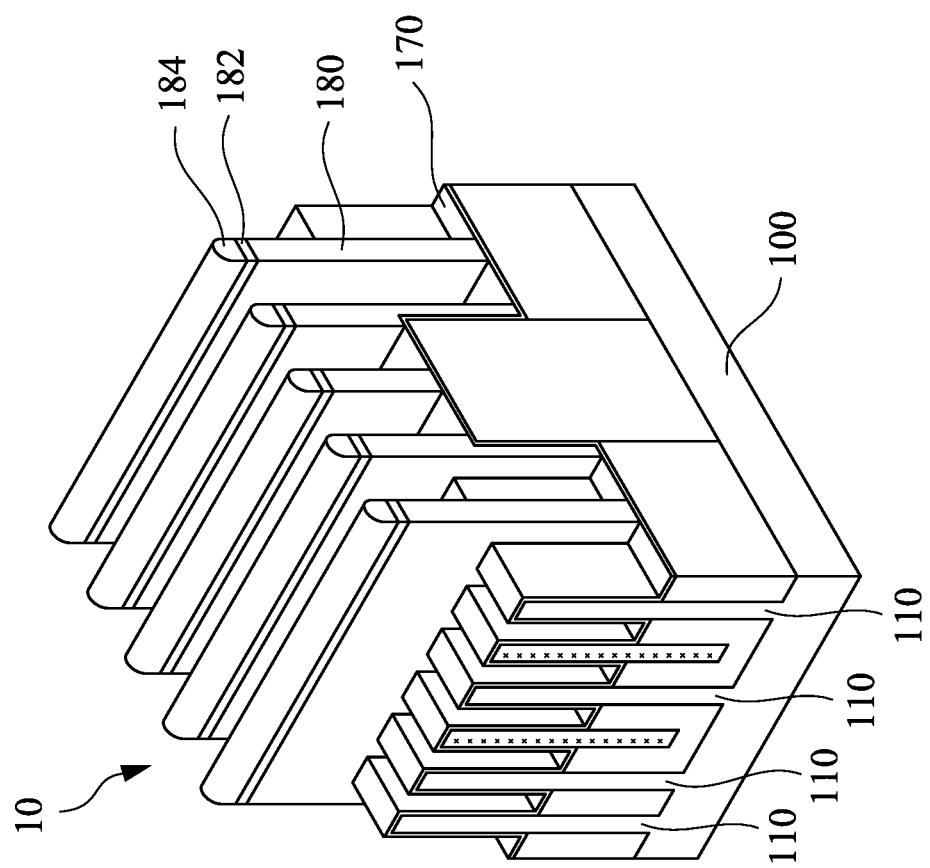
Figure 10D:
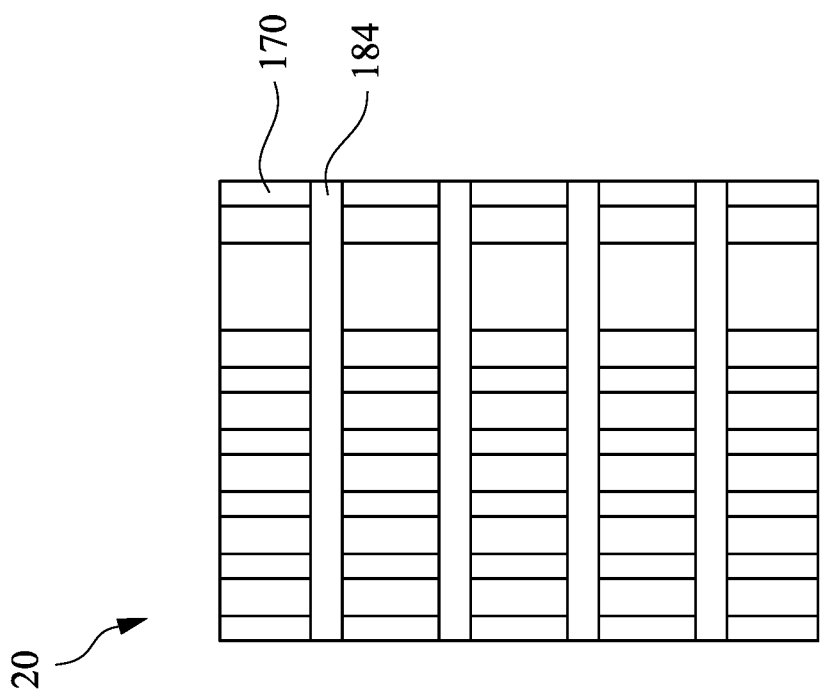
Figure 10C:
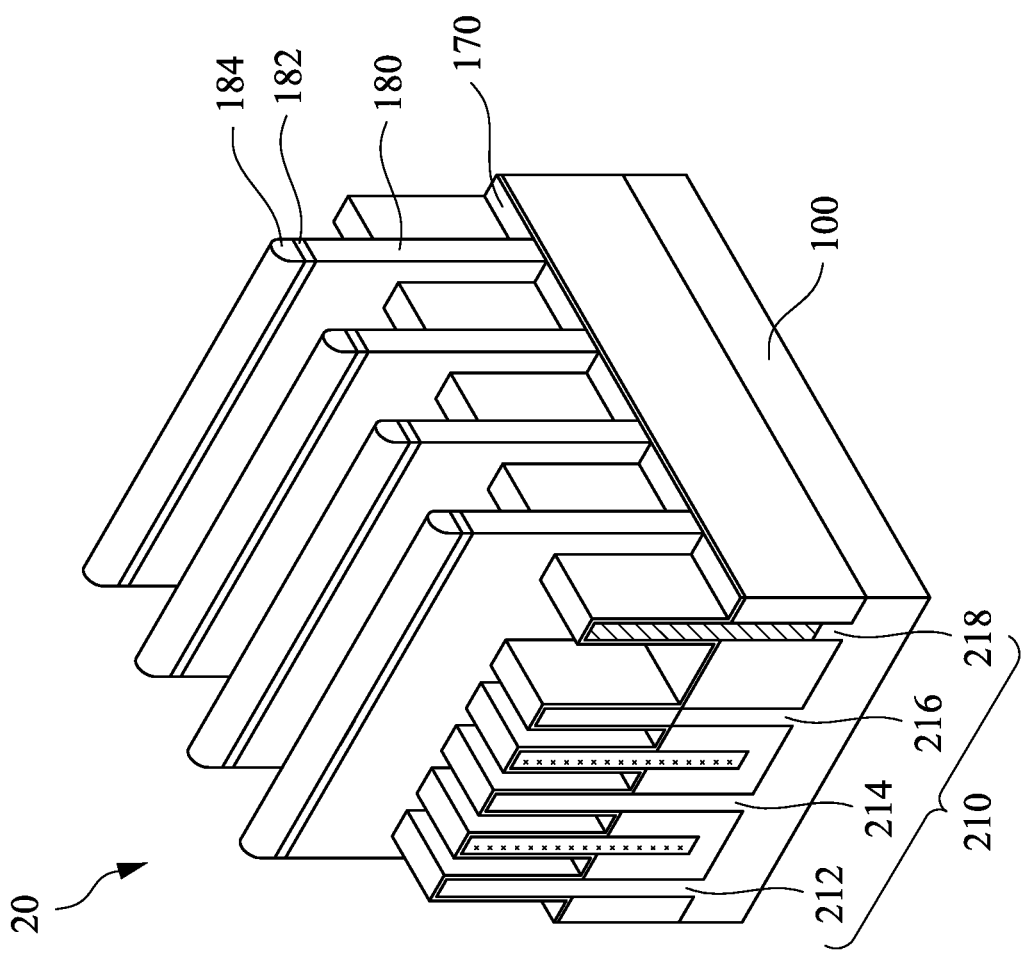

Reference is made to FIGS. 8A to 8F, in that FIG. 8E is a cross-sectional view taking along line E-E of FIG. 8C, and FIG. 8F is a cross-sectional view taking along line F-F of FIG. 8C. It is noted that the dielectric fins 160 may be separated into a dielectric fins 161, 162, and 163 for explanation. An etching process is performed to remove parts of the isolation layer 120. As a result, parts of the semiconductor fins 110 and 210 are exposed from the isolation layer 120. The remained portions of the isolation layer 120 are labeled as 122, and are referred to as isolation structure 122 in later discussions. The isolation structure 122 is disposed over the substrate 100 and in contact with the semiconductor fins 110 and 210, and the dielectric fins 160.

The top surface 1221 of the isolation structure 122 is in a position lower than the top surface 1451 of the dummy fins 145, the top surface 1101 of the semiconductor fins 110, the top surfaces 2121, 2141, 2161, and 2181 of the semiconductor fins 212, 214, 216, and 218, and the top surfaces 1611, 1621, and 1631 of the dielectric fins 161, 162, and 163. State differently, the height of the isolation structure 122 is lower than the heights of the semiconductor fins 210 and the dielectric fins 160. The dummy fins 145 are engaged in parts of the isolation structure 122, and the bottom surface 1452 of the dummy fins 145 is spaced from the substrate 100 by the isolation structure 122.

In FIGS. 8A and 8C, since the dummy fins 145, the semiconductor fins 110 and 210, the dielectric fins 160 are planarized during the process described in FIGS. 7A to 7D, the top surface 1451 of the dummy fins 145, the top surface 1101 of the semiconductor fins 110, the top surfaces 2121, 2141, 2161, and 2181 of the semiconductor fins 212, 214, 216, and 218, and the top surfaces 1611, 1621, and 1631 of the dielectric fins 161, 162, and 163 are substantially coplanar.

Reference is made to FIGS. 8C and 8E. The semiconductor fin 216 includes a base portion 216A and two protruding portions 216B and 216C protruding upward from the base portion 216B. The dielectric fin 161 is disposed between and in contact with the protruding portions 216B and 216C. From other perspectives, the base portion 216A of the semiconductor fin 216 extends under the dielectric fin 161. Further, the dielectric fin 161 is connected to the sidewall 2163 of the protruding portion 216B and the sidewall 2164 of the protruding portion 216C. The semiconductor fin 216 and the dielectric fin 161 can be collectively referred to as a fin structure 300.

Reference is made to FIGS. 8C and 8F. The semiconductor fin 218 includes a base portion 218A and a protruding portion 218B protruding upward from the base portion 216B. The dielectric fins 162 and 163 are disposed over the base portion 216A and are disposed on opposite sides of the protruding portion 218B of the semiconductor fin 218. From other perspectives, the base portion 218A of the semiconductor fin 218 extends under the dielectric fins 162 and 163. As shown in FIG. 8C, the sidewall 1622 of the dielectric fin 162 and the sidewall 2185 of the base portion 218A of the semiconductor fin 218 are substantially coplanar. The interface 2186 between the bottom of the dielectric fin 218 and the isolation structure 122 is below the top surface 1221 of the isolation structure 122. Similar features also present in the dielectric fin 163, and are not repeated herein. The semiconductor fin 218 and the dielectric fins 162 and 163 can be collectively referred to as a fin structure 310.

Referring back to FIG. 8D, the width W1 of the semiconductor fin 216 is substantially equal to the width W2 of the dielectric fin 161. Also, the width W3 of the semiconductor fin 218, the width W4 of the dielectric fin 162, and the width W5 of the dielectric fin 163 are substantially equal. The sidewall 2162 of the semiconductor fin 216 and the sidewall 1612 of the dielectric fin 161 are substantially coplanar, in which the sidewall 2162 is connected to the sidewall 2163 of the semiconductor fin 216. The sidewall 2182 of the semiconductor fin 218, the sidewall 1622 of the dielectric fin 162, and the sidewall 1632 of the dielectric fin 163 are substantially coplanar.

Reference is made to FIGS. 9A to 9D. A dielectric layer 170 is formed over the substrate 100 and conformally covers the structure of FIGS. 8A and 8C, i.e., the semiconductor fins 110 and 210, the dielectric fins 161, 162, and 163, the dummy fins 145, and the isolation structure 122. The dielectric layer 170 may act as gate dielectric in later process. The dielectric layer 170 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

Reference is made to FIGS. 10A to 10D. Plural dummy gates 180 are formed over the dielectric layer 170, in which the dummy gates 180 cross the semiconductor fins 110 and 210, the dielectric fins 161, 162, and 163, and the dummy fins 145. In some embodiments, mask layers 182 and 184 are formed over the dummy gates 180. The mask layers 182 and 184 acts as a hard mask during the patterning process of the dummy gates 180 and may act as a hard mask during the following processes, such as etching. In some embodiments, the mask layers 182 and 184 may include silicon oxide, silicon nitride and/or silicon oxynitride.

In some embodiments, the dummy gates 180 may include polycrystalline-silicon (poly-Si) or poly-crystalline silicon-germanium (poly-SiGe). Further, the dummy gates may be doped poly-silicon with uniform or non-uniform doping. In some embodiments, the dummy gates 180 may be formed by, for example, forming a dummy gate material layer over the dielectric layer 170. Patterned masks, such as mask layers 182 and 184, are formed over the stack of gate dielectric layer and dummy gate material layer. Then, the dummy gate material layer may be patterned using one or more etching processes, such as one or more dry plasma etching processes or one or more wet etching processes. During the etching process, the patterned mask may act as an etching mask. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the gate dielectric until the semiconductor fins 110 and 210 are exposed.

Reference is made to FIGS. 11A to 11D. Gate spacer structures including plural gate spacers 190 on opposite sidewalls of the dummy gates 180 are formed. In some embodiments, at least one of the gate spacers 190 includes single or multiple layers. The gate spacers 190 can be formed by blanket depositing one or more dielectric layer(s) (not shown) on the previously formed structure. The dielectric layer(s) may include silicon nitride (SiN), oxynitride, silicon carbon (SiC), silicon oxynitride (SiON), oxide, and the like. The gate spacers 190 may be formed by methods such as CVD, plasma enhanced CVD, sputter, or the like. The gate spacers 190 may then be patterned, such as by one or more etch processes to remove horizontal portions of the gate spacers 190 from the horizontal surfaces of the structure.

The dielectric layer 170 exposed from the dummy gates 180 and the gate spacers 190 are removed by suitable process, such as etching. The remained portions of the dielectric layer 170 are disposed under the dummy gates 180 and the gate spacers 190. Thus, the remained portions of the dielectric layer 170 may be referred to as gate dielectrics 170. Also, the dummy gates 180 and the remained dielectric 170 may collectively be referred to as dummy gate stacks 185.

Portions of the semiconductor fins 110 and 210, the dummy fins 145, and the dielectric fins 160 are exposed after the dielectric layer 170 are partially removed. Then, plural source/drain features 200 are respectively formed over the semiconductor fins 110 and 210 of the substrate 100. In some embodiments, the source/drain features 200 are in contact with the dummy fins 145, such that the formation of the source/drain features 200 are easily to be controlled.

In some embodiments, the source/drain features 200 may be epitaxy structures, and may also be referred to as epitaxy features 200. The source/drain features 200 may be formed using one or more epitaxy or epitaxial (epi) processes, such that Si features, SiGe features, and/or other suitable features can be formed in a crystalline state on the semiconductor fins 110 and 210. In some embodiments, the source/drain features 200 may be cladding over the semiconductor fins 110 and 210.

In some embodiments, lattice constants of the source/drain features 200 are different from lattice constants of the semiconductor fins 110 and 210, such that channels in the semiconductor fins 210 are strained or stressed to enable carrier mobility of the semiconductor device and enhance the device performance. In some embodiments, the source/drain features 200 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 110 (e.g., silicon). The source/drain features 200 may be in-situ doped. The doping species include P-type dopants, such as boron or $BF_2$; N-type dopants, such as phosphorus or arsenic; and/or other suitable dopants including combinations thereof. If the source/drain features 200 are not in-situ doped, a second implantation process (i.e., a junction implant process) is performed to dope the source/drain features 200. One or more annealing processes may be performed to activate the source/drain features 200. The annealing processes include rapid thermal annealing (RTA) and/or laser annealing processes.

Figure 11B:
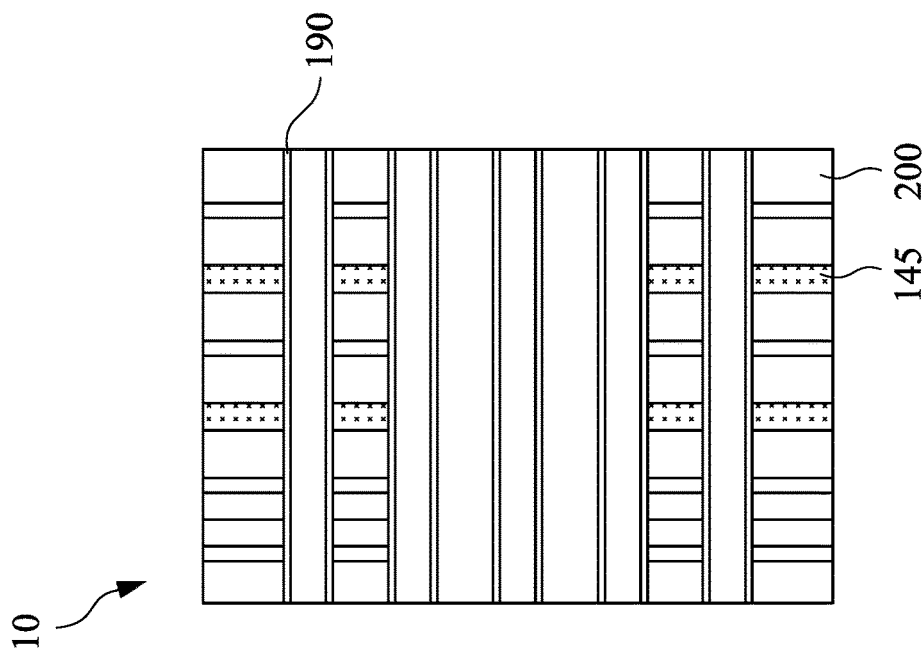
Figure 11A:
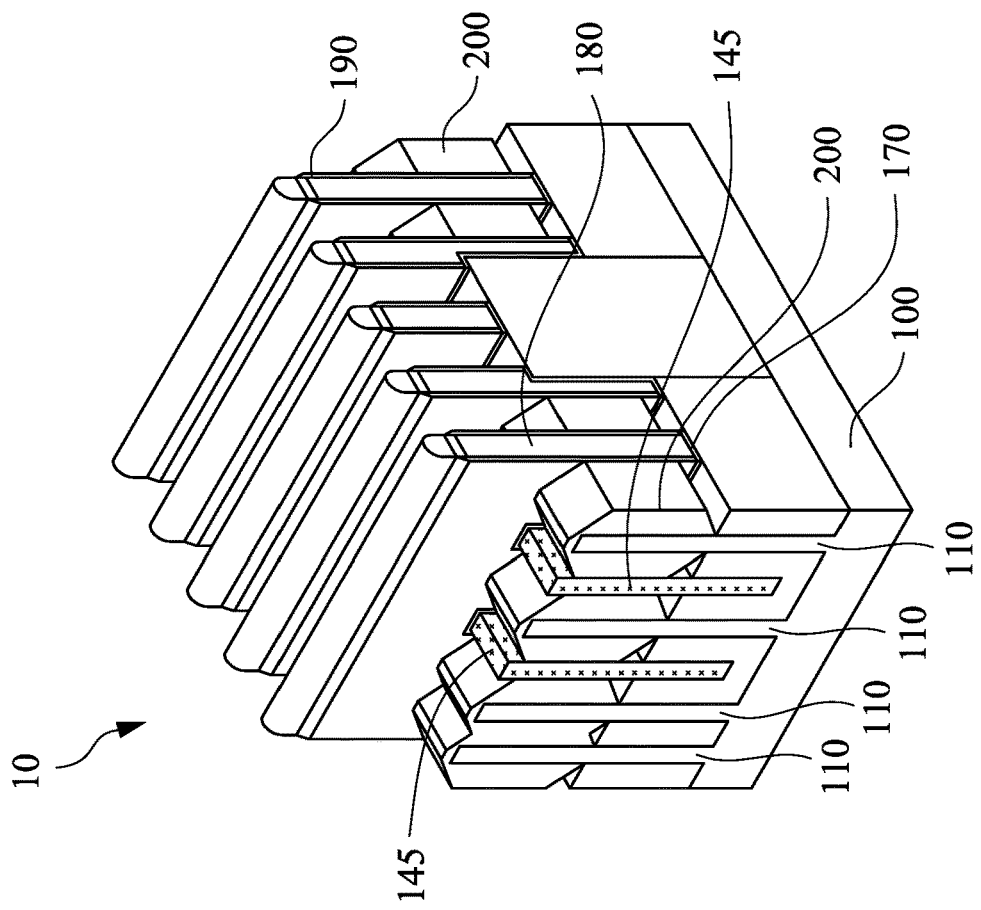
Figure 11D:
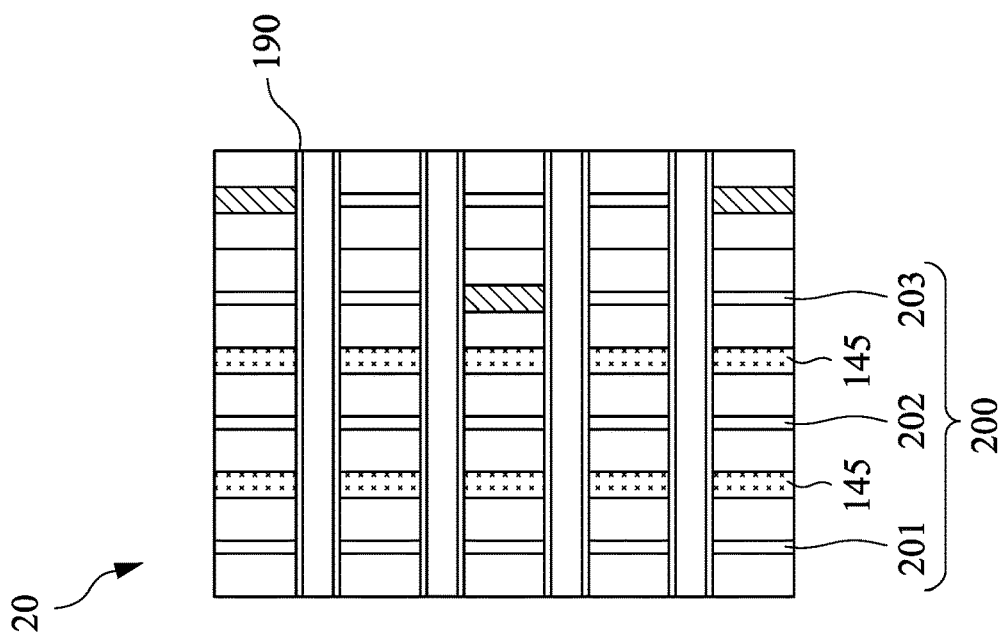
Figure 11C:
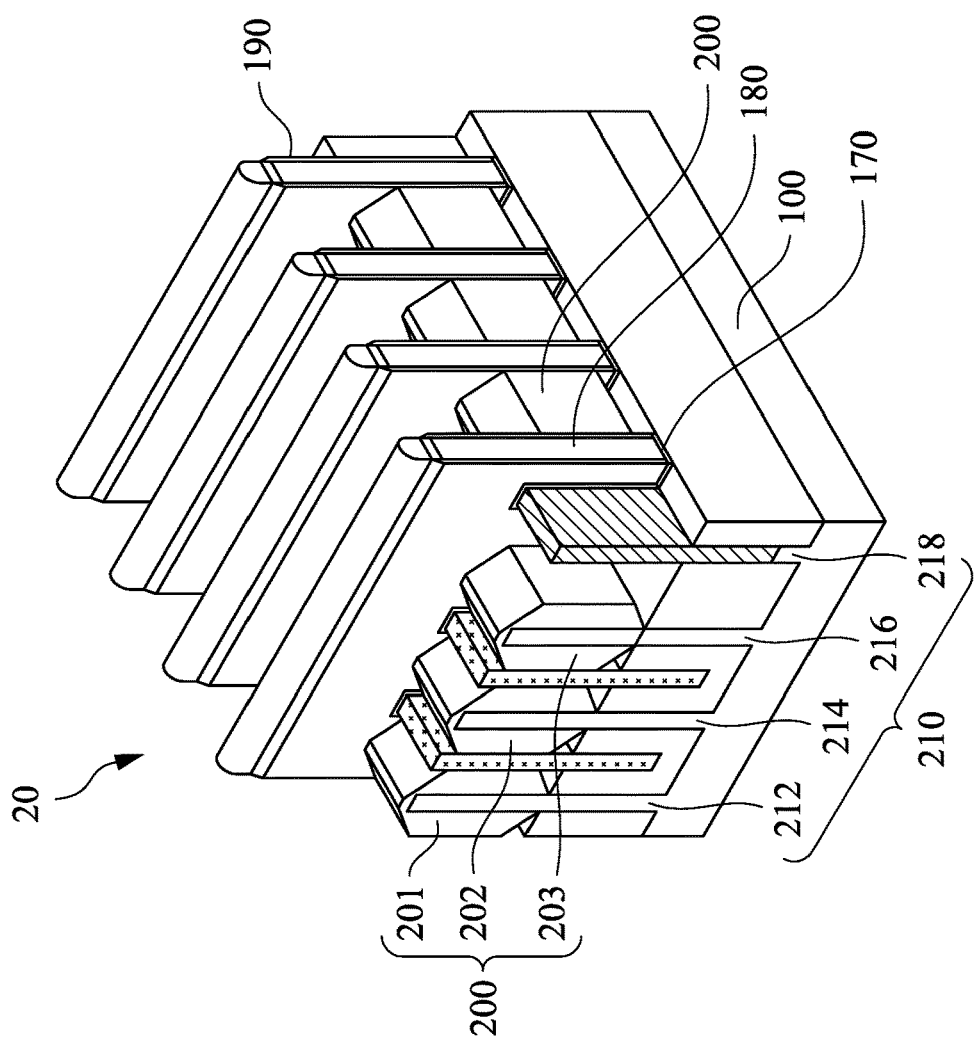
Figure 12B:
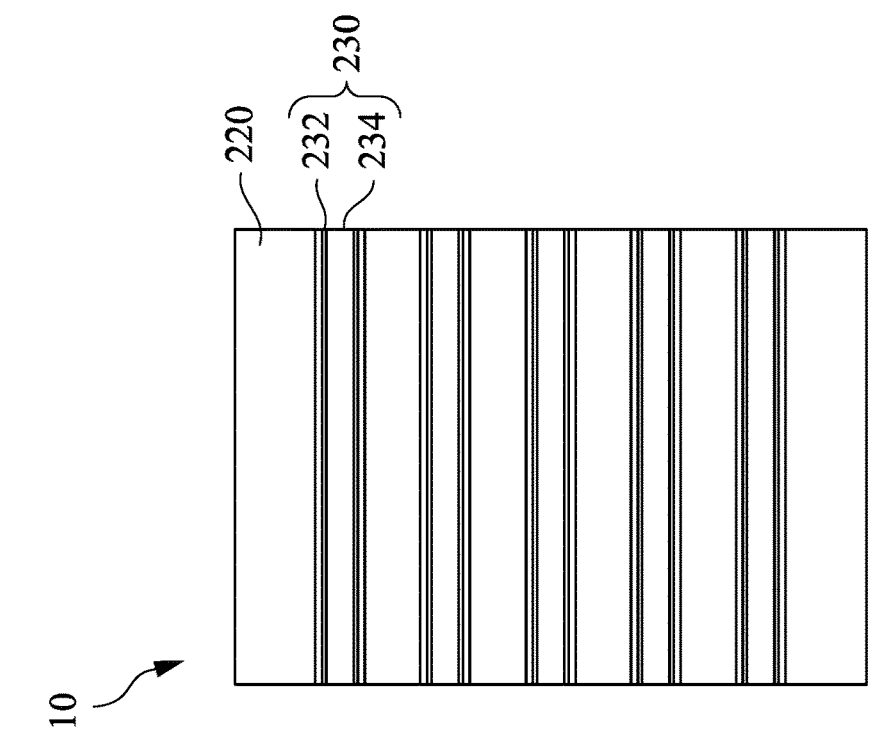
Figure 12A:
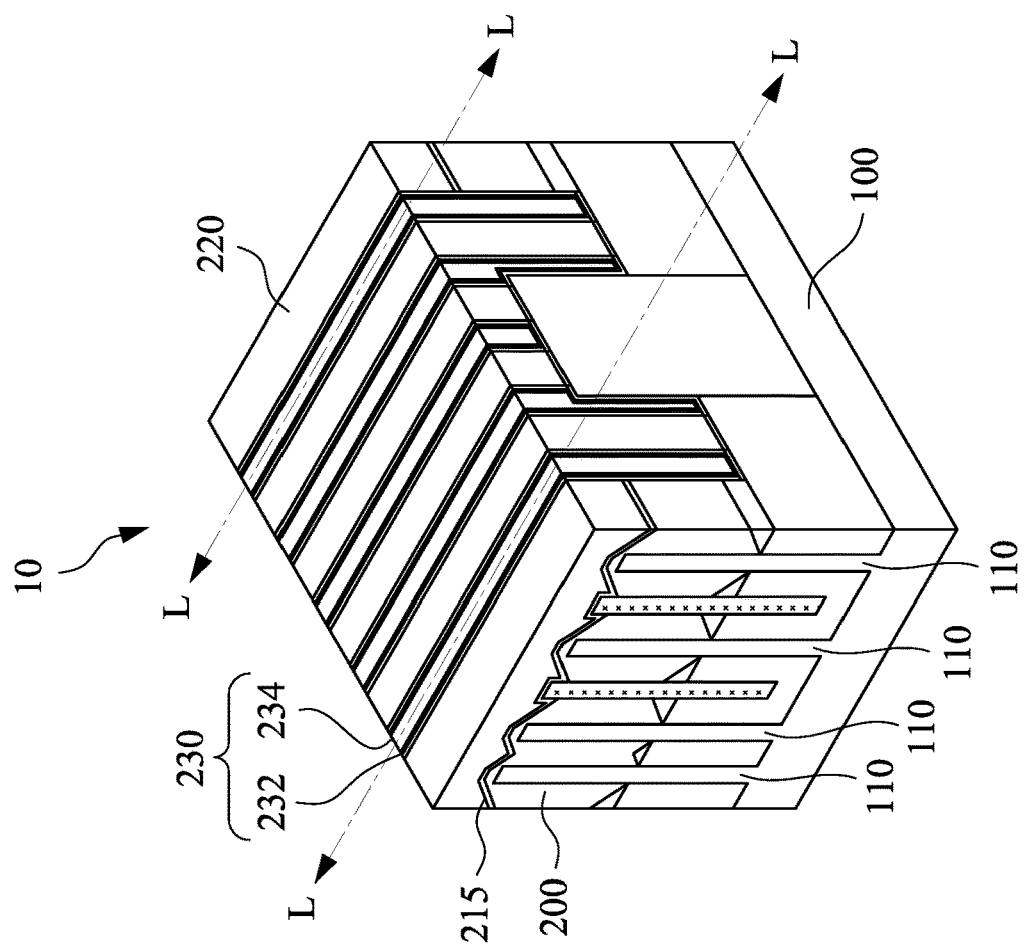
Figure 12D:
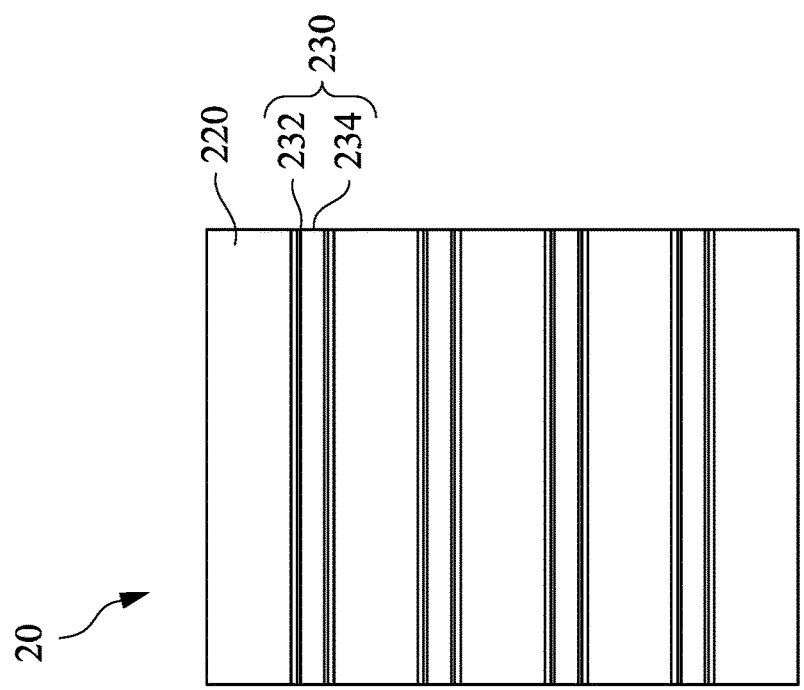
Figure 12C:
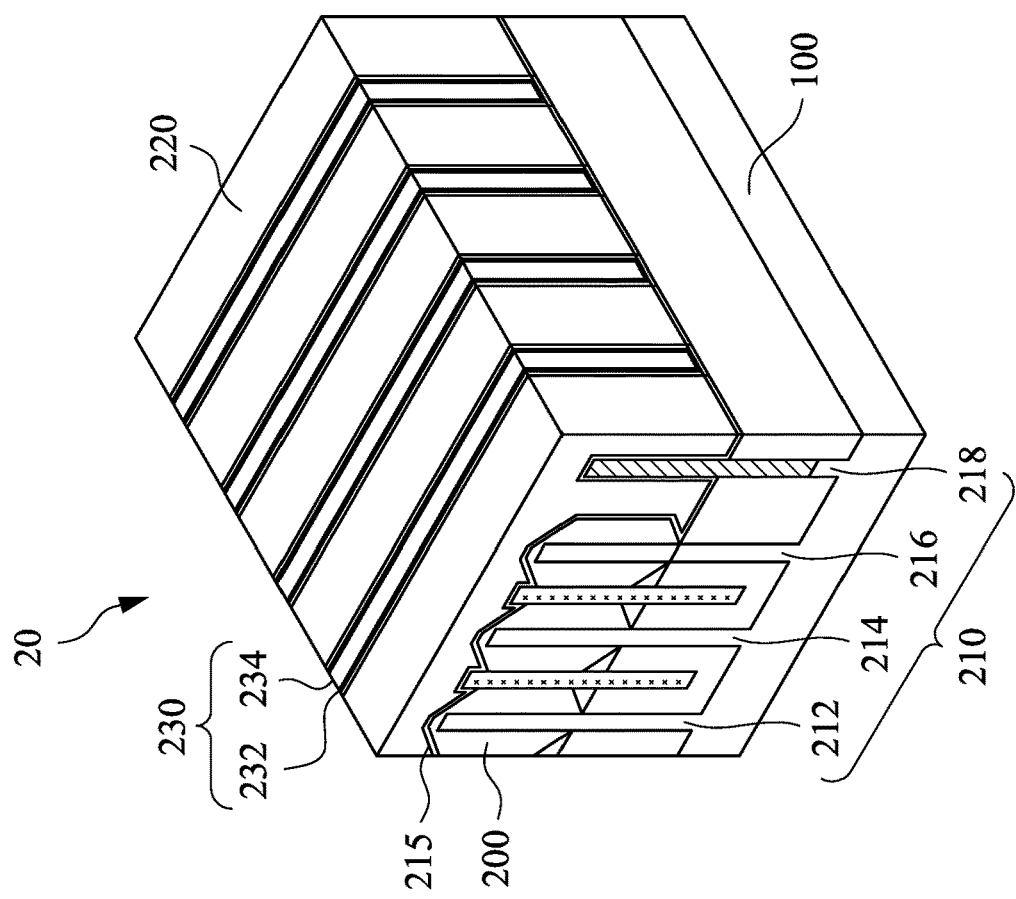

In FIGS. 11C and 11D, the source/drain features 200 may be separated in source/drain features 201, 202, and 203 for explanation. In some embodiments, the source/drain features 201 and 202 over the semiconductor fins 212 and 214 may include the same doping-type, and the source/drain feature 203 over the semiconductor fin 214 may include doping-type different from that of the source/drain features 201 and 202. For example, the source/drain features 201 and 202 may be n-type, and source/drain feature 203 may be p-type, and vise versa.

Reference is made to FIGS. 12A to 12D. An etching stop layer 215 is formed over the substrate 100 and covers the source/drain features 200, and an interlayer dielectric 220 is formed over the etching stop layer 215. Then, a CMP process is performed to remove the excessive interlayer dielectric 220, and the mask layers 182 and 184 (referring to FIGS. 10A to 10D) until the dummy gate stacks 185 are exposed.

In some embodiments, the interlayer dielectric 220 may include silicon nitride, silicon oxynitride, silicon oxycarbonitride, silicon carbide, silicon germanium, or combinations thereof. The interlayer dielectric 220 may be formed by a suitable technique, such as CVD, ALD and spin-on coating. In some embodiments, air gaps may be created in the interlayer dielectric 220.

Then, a replacement gate (RPG) process scheme is employed. The dummy gate stacks 185 are replaced with gate stacks 230. For example, the dummy gate stacks 185 are removed to from a plurality of gate trenches. The dummy gate stacks 185 are removed by a selective etch process, including a selective wet etch or a selective dry etch, and carries a substantially vertical profile of the gate spacers 190. The gate trenches expose portions of the semiconductor fins 110 and 210 of the substrate 100. Then, the gate stacks 230 are formed respectively in the gate trenches and cover the semiconductor fins 110 and 210 of the substrate 100.

The gate stacks 230 include an interfacial layer (not shown), gate dielectrics 232 formed over the interfacial layer, and gate metals 234 formed over the gate dielectrics 232. The gate dielectrics 232, as used and described herein, include dielectric materials having a high dielectric constant, for example, greater than that of thermal silicon oxide (~3.9). The gate metals 234 may include a metal, metal alloy, and/or metal silicide.

In some embodiments, the gate metals 234 included in the gate stacks 230 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. For example, the gate metals 234 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process.

In some embodiments, the interfacial layer may include a dielectric material such as silicon oxide ($SiO_2$), HfSiO, and/or silicon oxynitride (SiON). The interfacial layer may be formed by chemical oxidation, thermal oxidation, ALD, CVD, and/or other suitable method. The gate dielectrics 232 may include a high-K dielectric layer such as hafnium oxide ($HfO_2$). Alternatively, the gate dielectrics 232 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectrics 232 may be formed by ALD, PVD, CVD, oxidation, and/or other suitable methods.

Figure 13B:
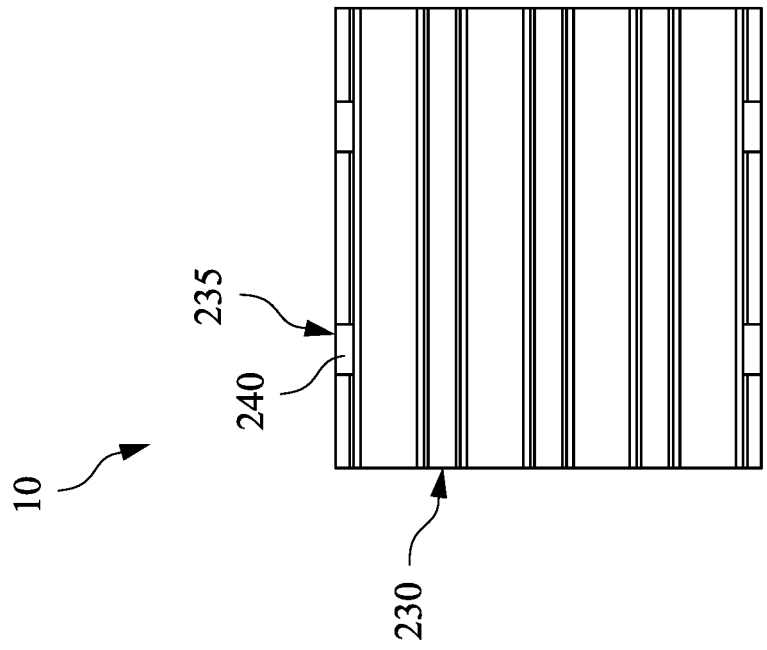
Figure 13A:
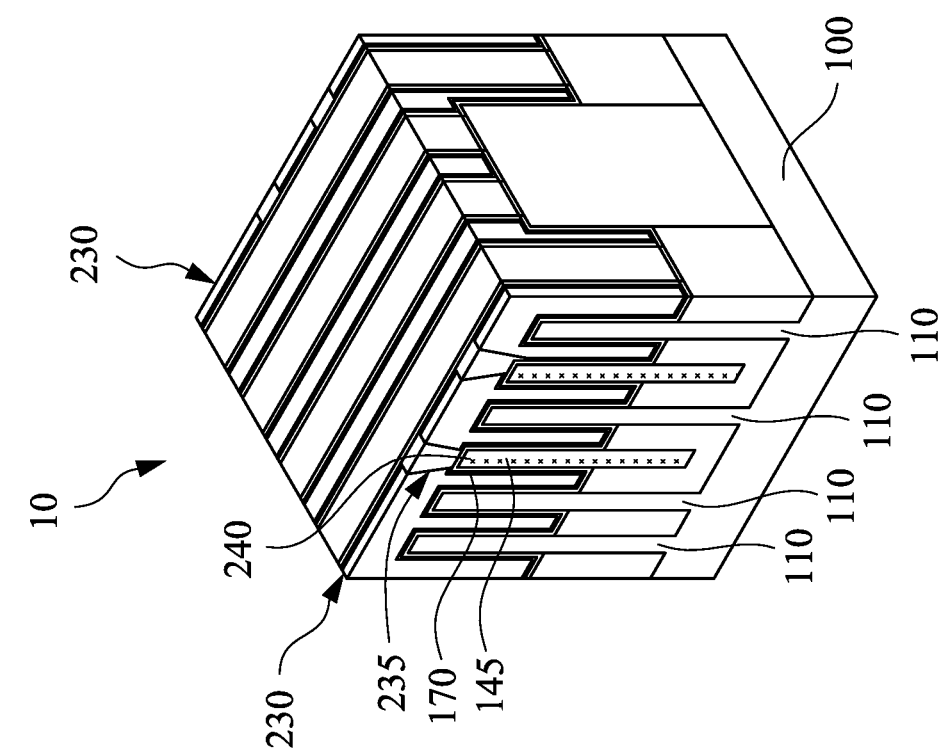
Figure 13D:
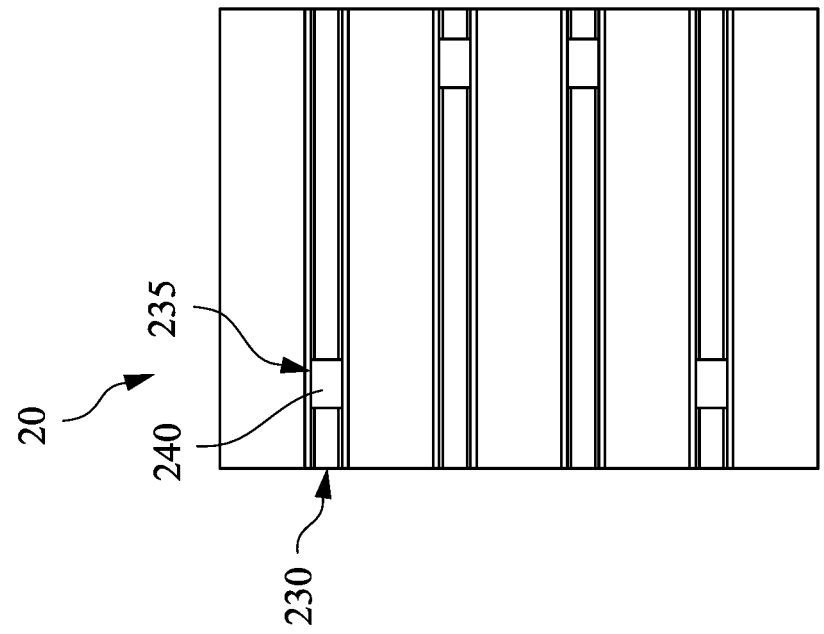
Figure 13C:
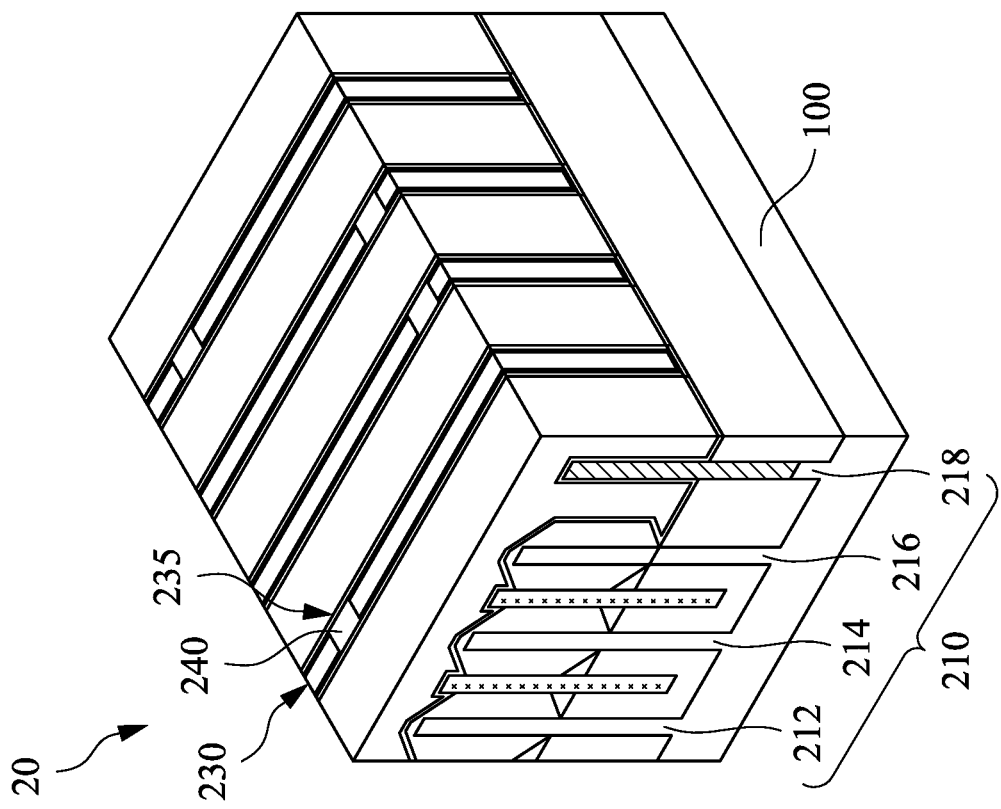
Figure 14B:
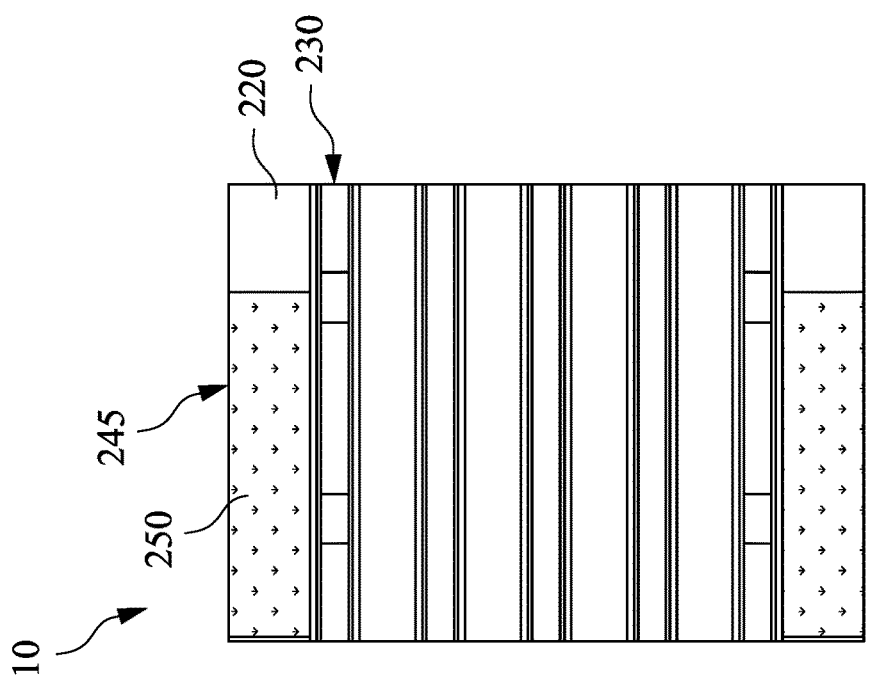
Figure 14A:
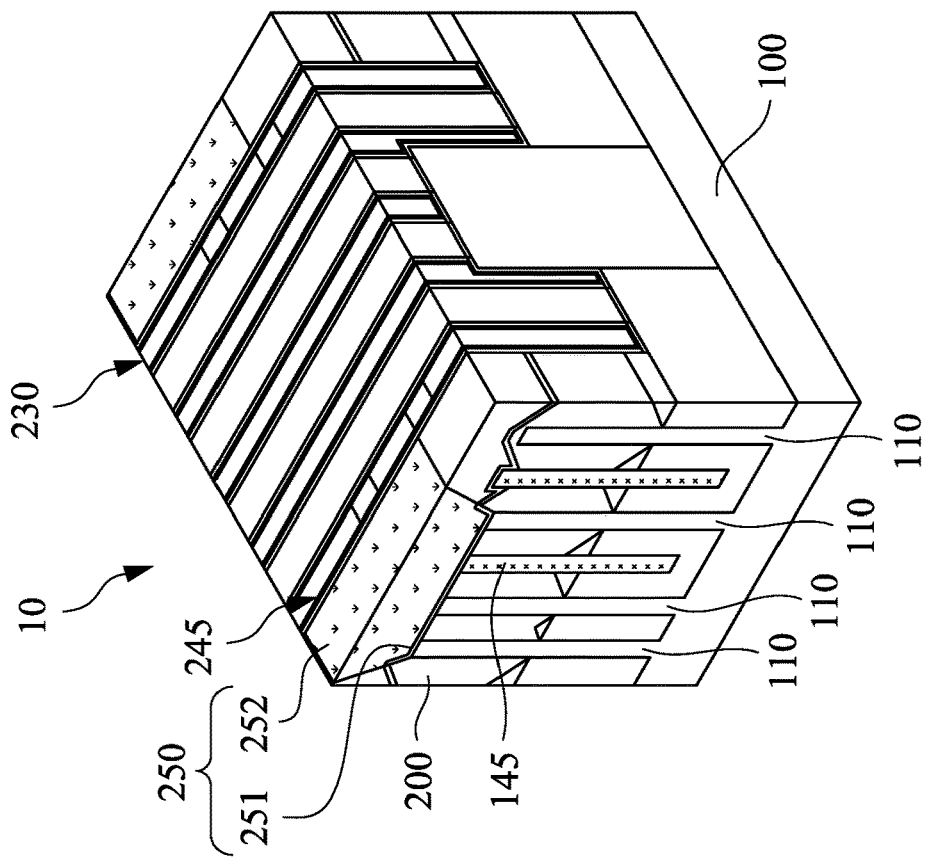
Figure 14D:
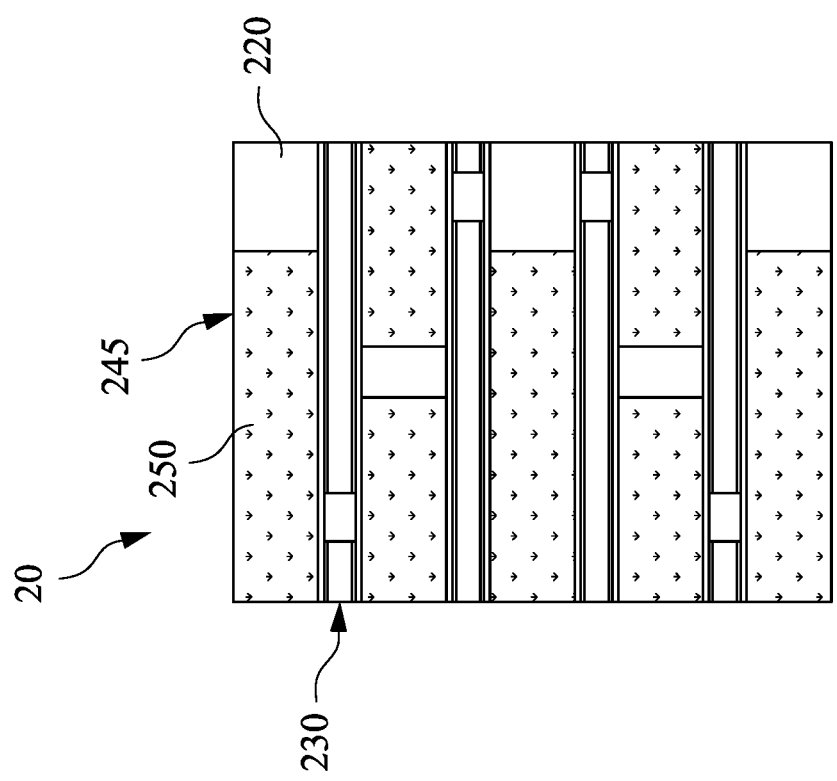
Figure 14C:
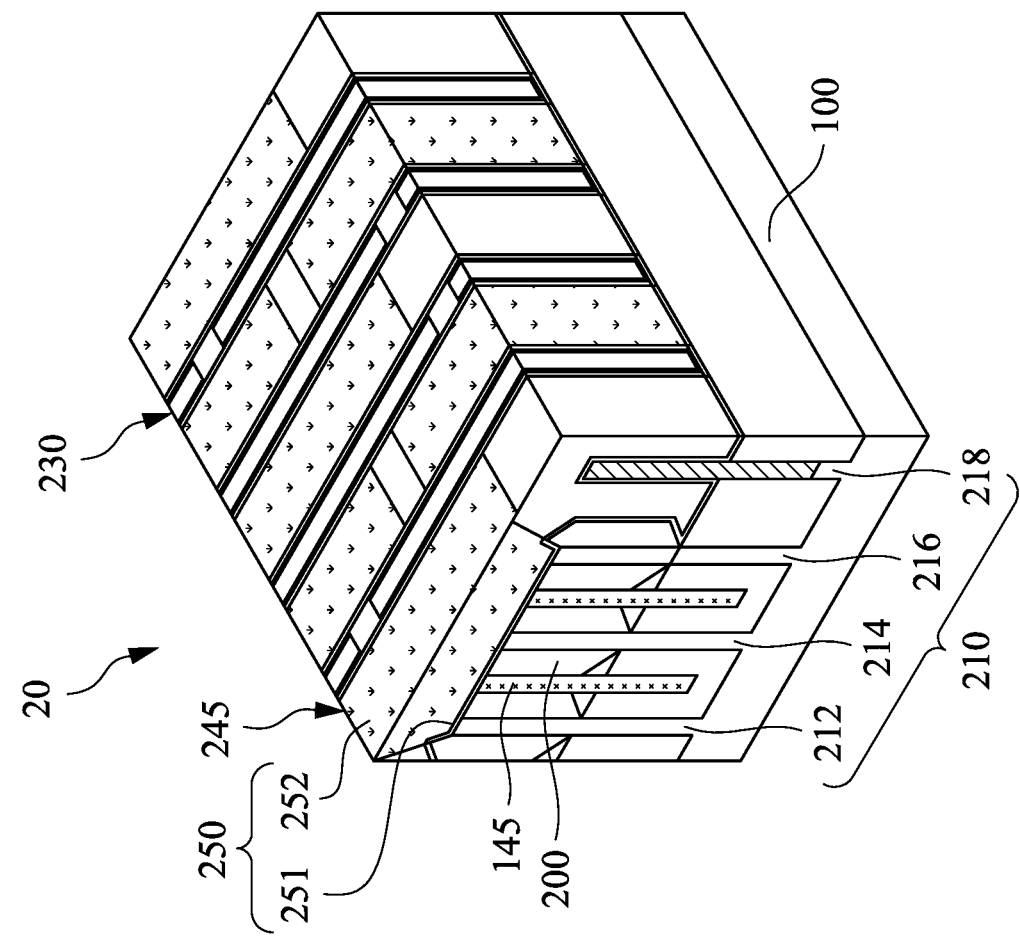

Reference is made to FIGS. 13A to 13D. For the ease of watching, the cross-section of FIGS. 13A and 13B are taking along line L-L of FIGS. 12A and 12B, respectively. An etching process is performed to remove portions of the gate stacks 230. During the etching process, plural openings 235 are formed in the gate stacks 230. In some embodiments, the openings 235 expose at least portions of the dummy fins 145, as shown in FIG. 13A.

Then, plural isolation features 240 are formed in the openings 235. In some embodiments, the isolation features 240 may be formed by depositing a dielectric layer blanketing the substrate 100. Then, a CMP process is performed to remove the excessive dielectric layer until the gate stacks 230 are exposed. Some of the isolation features 240 are in contact with the gate dielectric 170 and over the dummy fins 145. That is, some of the isolation features 240 are align with the dummy fins 145.

Reference is made to FIGS. 14A to 14D. An etching process is performed to remove portions of the interlayer dielectric 220 and the etching stop layer 215. Thus, plural openings 245 are formed in the interlayer dielectric 220 and the etching stop layer 215 to expose the source/drain features 200 and the dummy fins 145.

Then, plural contacts 250 are formed in the openings 245. The contacts 250 may be formed by depositing a conductive material layer over the substrate 100 and following with a CMP process until the gate stacks 230 are exposed. In some embodiments, the contacts 250 are in contact with the source/drain features 200 and the dummy fins 145. For example, in FIG. 14C, one of the contacts 250 is in contact with the source/drain features 200 over the semiconductor fins 212, 214, and 216, and is in contact with the dummy fins 145 between the semiconductor fins 212, 214, and 216. Since the source/drain features 200 are in contact with the dummy fins 145, the contacts 250 may have improved quality. The dummy fins 145 can support the contacts 250, such that the contacts 250 do not extend further into a space between the source/drain features 200. In some embodiments, at least one of the contacts 250 includes a barrier layer 251 and conductive layer 252. In some embodiments, the conductive layer 252 may include suitable metal, such as TiN, WN, TaN, or Ru, which performs in a p-type FinFET. In some alternative embodiments, the metal layer may include suitable metal, such as Ti, Ag, Al, TiAl, TiAlN, TiAlC, TiAlCN, TaC, TaCN, TaSiN, Mn, or Zr, which performs in an n-type FinFET. In some other embodiments, the contacts 250 may be multi-layer including, work function layers, liner layers, interface layers, seed layers, adhesion layers, barrier layers and so on.

According to aforementioned embodiments, plural semiconductor fins are partially removed to form a recess defined by the semiconductor fins and an isolation structure connected to the semiconductor fins. A dielectric layer is formed to fill the recess. Accordingly, plural dielectric fins are formed in the recess, in which the dielectric fins are in contact with the semiconductor fins. Moreover, plural dummy fins are formed between two adjacent semiconductor fins and engaged in the isolation structure. With such configurations, the structural strength may be improved. Also, plural epitaxy structures are formed over the semiconductor fins and in contact with the dummy fins. As a result, the formation of the epitaxy structures is easily to be controlled, and the contact formed over the epitaxy structures may have improved quality.

An embodiment of the present disclosure is a semiconductor device includes a substrate, a first dielectric fin, a semiconductor fin, a metal gate structure, an epitaxy structure, and a contact etch stop layer. The first dielectric fin is disposed over the substrate. The semiconductor fin is disposed over the substrate, in which along a lengthwise direction of the first dielectric fin and the semiconductor fin, the first dielectric fin is in contact with a first sidewall of the semiconductor fin. The metal gate structure crosses the first dielectric fin and the semiconductor fin. The epitaxy structure is over and in contact with the semiconductor fin. The contact etch stop layer is over and in contact with first dielectric fin.

An embodiment of the present disclosure is a semiconductor device includes a substrate, a first dielectric fin, a second dielectric fin, a semiconductor fin, and a metal gate structure. The first dielectric fin and a second dielectric fin are disposed over the substrate, in which a bottom surface of the first dielectric fin is lower than a bottom surface of the second dielectric fin. The semiconductor fin is disposed over the substrate, in which the semiconductor fin is between the first dielectric fin and the second dielectric fin, and a distance between the first dielectric fin and the semiconductor fin is less than a distance between the second dielectric fin and the semiconductor fin. The metal gate structure crosses the first dielectric fin, the second dielectric fin, and the semiconductor fin.

An embodiment of the present disclosure is a semiconductor device includes substrate, a first dielectric fin, first epitaxy structure, contact etch stop layer, and a metal gate structure. The first dielectric fin is over the substrate. The first epitaxy structure is over the first semiconductor fin, in which a first sidewall of the first epitaxy structure is in contact with the first dielectric fin. The contact etch stop layer is over the first epitaxy structure, in which a second sidewall of the first epitaxy structure farthest to the first sidewall of the first epitaxy structure is in contact with the contact etch stop layer. The metal gate structure crosses the semiconductor fin and the first dielectric fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
a first dielectric fin disposed over the substrate;
a semiconductor fin disposed over the substrate, wherein along a lengthwise direction of the first dielectric fin and the semiconductor fin, the first dielectric fin is in contact with a first sidewall of the semiconductor fin;
a metal gate structure crossing the first dielectric fin and the semiconductor fin;
an epitaxy structure over and in contact with the semiconductor fin; and
a contact etch stop layer over and in contact with first dielectric fin.

2. The semiconductor device of claim 1, wherein a width of the first dielectric fin is substantially the same as width of the semiconductor fin.

3. The semiconductor device of claim 1, wherein the first dielectric fin is free from coverage of the epitaxy structure.

4. The semiconductor device of claim 1, further comprising a second dielectric fin disposed over the substrate, wherein the second dielectric fin is in contact with a second sidewall of the semiconductor fin opposite to the first sidewall of the semiconductor fin.

5. The semiconductor device of claim 4, wherein a sidewall of the first dielectric fin, a sidewall of the semiconductor fin, and a sidewall of the second dielectric fin are coterminous.

6. The semiconductor device of claim 1, further comprising a shallow trench isolation (STI) structure adjacent to the first dielectric fin, wherein a bottom surface of the STI structure is lower than a bottom surface of the first dielectric fin.

7. The semiconductor device of claim 6, wherein the STI structure crosses an interface between the first dielectric fin and the semiconductor fin.

8. A semiconductor device, comprising:
a substrate;
a first dielectric fin and a second dielectric fin disposed over the substrate, wherein a bottom surface of the first dielectric fin is lower than a bottom surface of the second dielectric fin;
a semiconductor fin disposed over the substrate, wherein the semiconductor fin is between the first dielectric fin and the second dielectric fin;
a metal gate structure crossing the first dielectric fin, the second dielectric fin, and the semiconductor fin; and
a contact etch stop layer over and in contact with first dielectric fin.

9. The semiconductor device of claim 8, further comprising a contact over and in contact with the second dielectric fin, wherein the first dielectric fin is separated from the contact.

10. The semiconductor device of claim 9, wherein the contact etch stop layer extends from a sidewall of the contact to a sidewall of the first dielectric fin.

11. The semiconductor device of claim 9, further comprising an epitaxy structure over the semiconductor fin, wherein the contact is in contact with the epitaxy structure.

12. The semiconductor device of claim 11, wherein the contact etch stop layer is in contact with the epitaxy structure.

13. The semiconductor device of claim 8, wherein along a lengthwise direction of the first dielectric fin and the second dielectric fin, the second dielectric fin is longer than the first dielectric fin.

14. A semiconductor device, comprising:
a substrate comprising a semiconductor fin;
a first dielectric fin over the substrate, wherein the semiconductor fin and the first dielectric fin are arranged along a direction perpendicular to a lengthwise direction of the semiconductor fin;
an epitaxy structure over the semiconductor fin;
a metal gate structure crossing the semiconductor fin and the first dielectric fin; and
a contact etch stop layer over and in contact with the epitaxy structure and the first dielectric fin.

15. The semiconductor device of claim 14, further comprising a second dielectric fin over the substrate, the semiconductor fin being between the first and second dielectric fins.

16. The semiconductor device of claim 15, wherein a bottom surface of the first dielectric fin is lower than a bottom surface of the second dielectric fin.

17. The semiconductor device of claim 15, further comprising an isolation structure adjacent the semiconductor fin, wherein a portion of the second dielectric fin is embedded in the isolation structure.

18. The semiconductor device of claim 14, wherein the contact etch stop layer is in contact with opposite sidewalls and a top surface of the first dielectric fin.

19. The semiconductor device of claim 14, further comprising an interlayer dielectric layer between the semiconductor fin and the first dielectric fin.

20. The semiconductor device of claim 14, further comprising an isolation structure between the semiconductor fin and the first dielectric fin, wherein the contact etch stop layer is contact with a top surface of the isolation structure.

* * * * *